(12) United States Patent
Kim et al.

(10) Patent No.: US 11,967,595 B2
(45) Date of Patent: Apr. 23, 2024

(54) SEMICONDUCTOR DEVICES WITH NANOWIRES AND METHODS FOR FABRICATING THE SAME

(71) Applicant: Samsung Electronics Co., Ltd., Suwon-si (KR)

(72) Inventors: Jae Jung Kim, Suwon-si (KR); Young Suk Chai, Seoul (KR); Sang Yong Kim, Suwon-si (KR); Hoon Joo Na, Hwaseong-si (KR); Sang Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 824 days.

(21) Appl. No.: 17/038,964

(22) Filed: Sep. 30, 2020

(65) Prior Publication Data

US 2021/0013207 A1 Jan. 14, 2021

Related U.S. Application Data

(63) Continuation of application No. 16/203,946, filed on Nov. 29, 2018, now Pat. No. 10,847,515, which is a (Continued)

(30) Foreign Application Priority Data

Sep. 6, 2016 (KR) .......................... 10-2016-0114475

(51) Int. Cl.
*H01L 27/092* (2006.01)
*B82Y 10/00* (2011.01)
(Continued)

(52) U.S. Cl.
CPC .......... *H01L 27/0924* (2013.01); *B82Y 10/00* (2013.01); *H01L 21/02603* (2013.01);
(Continued)

(58) Field of Classification Search
CPC ....... H01L 21/823821; H01L 21/02603; H01L 21/833842; H01L 27/0924; H01L 29/0653;
(Continued)

(56) References Cited

U.S. PATENT DOCUMENTS

| 6,605,847 B2 | 8/2003 | Kim et al. |
| 7,381,601 B2 * | 6/2008 | Kim ........................ H01L 29/78 438/300 |

(Continued)

FOREIGN PATENT DOCUMENTS

| CN | 104347630 A | 2/2015 |
| KR | 20150016166 A | 2/2015 |

*Primary Examiner* — Igwe U Anya
(74) *Attorney, Agent, or Firm* — Myers Bigel, P.A.

(57) ABSTRACT

A semiconductor device may include a substrate, a first nanowire, a second nanowire, a first gate insulating layer, a second gate insulating layer, a first metal layer and a second metal layer. The first gate insulating layer may be along a periphery of the first nanowire. The second gate insulating layer may be along a periphery of the second nanowire. The first metal layer may be on a top surface of the first gate insulating layer along the periphery of the first nanowire. The first metal layer may have a first crystal grain size. The second metal layer may be on a top surface of the second gate insulating layer along the periphery of the second nanowire. The second metal layer may have a second crystal grain size different from the first crystal grain size.

20 Claims, 35 Drawing Sheets

Related U.S. Application Data continuation of application No. 15/452,203, filed on Mar. 7, 2017, now Pat. No. 10,177,149.

(51) Int. Cl.
| | |
|---|---|
| *H01L 21/02* | (2006.01) |
| *H01L 21/8238* | (2006.01) |
| *H01L 29/06* | (2006.01) |
| *H01L 29/08* | (2006.01) |
| *H01L 29/10* | (2006.01) |
| *H01L 29/40* | (2006.01) |
| *H01L 29/423* | (2006.01) |
| *H01L 29/49* | (2006.01) |
| *H01L 29/66* | (2006.01) |
| *H01L 29/775* | (2006.01) |
| *H01L 29/78* | (2006.01) |

(52) U.S. Cl.
CPC ........... *H01L 21/823821* (2013.01); *H01L 21/823842* (2013.01); *H01L 29/0653* (2013.01); *H01L 29/0673* (2013.01); *H01L 29/0847* (2013.01); *H01L 29/1054* (2013.01); *H01L 29/1079* (2013.01); *H01L 29/401* (2013.01); *H01L 29/42364* (2013.01); *H01L 29/42392* (2013.01); *H01L 29/495* (2013.01); *H01L 29/66439* (2013.01); *H01L 29/66545* (2013.01); *H01L 29/775* (2013.01); *H01L 29/7845* (2013.01)

(58) Field of Classification Search
CPC ........... H01L 29/0673; H01L 29/0847; H01L 29/1054; H01L 29/401; H01L 29/42392; H01L 29/66545

USPC ............................................................ 257/9
See application file for complete search history.

(56) References Cited

U.S. PATENT DOCUMENTS

| | | |
|---|---|---|
| 8,216,935 B2 | 7/2012 | Blomiley et al. |
| 8,435,845 B2 | 5/2013 | Ning et al. |
| 9,224,754 B2 | 12/2015 | Rakshit et al. |
| 9,306,038 B1 | 4/2016 | Chan et al. |
| 2007/0108529 A1 | 5/2007 | Huang et al. |
| 2009/0315114 A1 | 12/2009 | Rakshit et al. |
| 2010/0078729 A1 | 4/2010 | Fukutome et al. |
| 2011/0081774 A1 | 4/2011 | Yeh et al. |
| 2012/0045880 A1 | 2/2012 | Ma et al. |
| 2013/0221441 A1 | 8/2013 | Jagannathan et al. |
| 2015/0034899 A1* | 2/2015 | Ching ............... H01L 29/1033 438/154 |
| 2015/0048359 A1 | 2/2015 | Fukase et al. |
| 2015/0090958 A1* | 4/2015 | Yang ............... H01L 29/0847 257/27 |
| 2016/0043085 A1* | 2/2016 | Ching ............... H01L 27/092 257/369 |
| 2016/0079395 A1 | 3/2016 | Sim et al. |
| 2016/0099339 A1 | 4/2016 | Zhang et al. |
| 2016/0111494 A1 | 4/2016 | Cheng et al. |
| 2017/0018462 A1* | 1/2017 | Suk ............... H01L 29/78696 |
| 2017/0018623 A1* | 1/2017 | Suk ............... H01L 29/0673 |
| 2017/0117375 A1* | 4/2017 | Kim ............... H01L 29/785 |
| 2017/0162651 A1* | 6/2017 | Suk ............... H01L 29/41775 |

* cited by examiner

SEMICONDUCTOR DEVICES WITH NANOWIRES AND METHODS FOR FABRICATING THE SAME

CROSS-REFERENCE TO RELATED APPLICATIONS

This application is a continuation application of and claims priority from U.S. application Ser. No. 16/203,946, filed on Nov. 29, 2018, which itself is a continuation application of and claims priority from U.S. application Ser. No. 15/452,203, now U.S. Pat. No. 10,177,149, filed on Mar. 7, 2017, which claims priority under 35 U.S.C. § 119 to Korean Patent Application No. 10-2016-0114475, filed on Sep. 6, 2016, the disclosures of which are hereby incorporated by reference in their entireties.

FIELD

Embodiments of the inventive concepts disclosed herein relate to semiconductor devices and, more particularly, to semiconductor devices with multi-gate transistors and methods for fabricating the same.

BACKGROUND

As one of the scaling technologies to increase the density of semiconductor devices, multi-gate transistors have been suggested, in which silicon bodies in a fin or nanowire shape are formed on a substrate, with gates then being formed on surfaces of the silicon bodies.

Multi-gate transistors that include a three-dimensional channel may allow for improved scaling. Further, current control capability can be enhanced without requiring increased gate length of the multi-gate transistor. Furthermore, it may be possible to effectively reduce or suppress short channel effect (SCE) which is the phenomenon that the electric potential of the channel region is influenced by the drain voltage.

SUMMARY

Some embodiments of the inventive concepts may provide semiconductor devices with improved operating characteristics.

Some embodiments of the inventive concepts may provide methods of fabricating semiconductor devices with improved operating characteristics.

According to some embodiments of the inventive concepts, semiconductor devices are provided. A semiconductor device may include a substrate, a first nanowire, a second nanowire, a first gate insulating layer, a second gate insulating layer, a first metal layer and a second metal layer. The substrate may include a first region and a second region. The first nanowire may be extended in a first direction and be spaced apart from the substrate in the first region. The second nanowire may be extended in a second direction and be spaced apart from the substrate in the second region. The first gate insulating layer may be along a periphery of the first nanowire. The second gate insulating layer may be along a periphery of the second nanowire. The first metal layer may be on a top surface of the first gate insulating layer along the periphery of the first nanowire, and may have a first crystal grain size. The second metal layer may be formed on a top surface of the second gate insulating layer along the periphery of the second nanowire, and may have a second crystal grain size different from the first crystal grain size.

According to some embodiments of the inventive concepts, semiconductor devices are provided. A semiconductor device may include a substrate, a first nanowire, a second nanowire, a first gate insulating layer, a second gate insulating layer, a first metal layer, a first fill metal and a second fill metal. The substrate may include a first region and a second region. The first nanowire may be extended in a first direction and be spaced apart from the substrate in the first direction. The second nanowire may be extended in a second direction and be spaced apart from the substrate in the second direction. The first gate insulating layer may be along a periphery of the first nanowire. The second gate insulating layer may be along a periphery of the second nanowire. The first metal layer may be on a top surface of the first gate insulating layer along the periphery of the first nanowire and having a first crystal grain size. The first fill metal may be on a top surface of the first metal layer along the periphery of the first nanowire and extending in a third direction intersecting the first direction. The second fill metal may be on a top surface of the second gate insulating layer along the periphery of the second nanowire and may extend in a fourth direction intersecting the second direction.

According to some embodiments of the inventive concepts, methods of fabricating semiconductor devices may be provided. A method of fabricating a semiconductor device may include providing a substrate including a first region and a second region, forming a first nanowire and a second nanowire in the first region and second region, respectively, forming a first gate insulating layer along the first nanowire and a second gate insulating layer along the second nanowire, forming a blocking layer covering the first region and exposing the second region, performing a surface treatment of the second nanowire, removing the blocking layer, and forming a first metal layer along the first nanowire and a second metal layer along the second nanowire. A crystal grain size of the first metal layer and a crystal grain size of the second metal layer are different from each other.

According to some embodiments of the inventive concepts, semiconductor devices are provided. A semiconductor device may include a substrate, a first transistor, and a second transistor. The first transistor may be on the substrate. The first transistor may include a first nanowire channel region, a first gate along the first nanowire channel region, and a first gate insulating layer between the first nanowire channel region and the first gate. The first gate may include a first metal layer along the first nanowire channel region and may include a first crystal grain size. The second transistor may be on the substrate. The second transistor may include a second nanowire channel region, a second gate along the second nanowire channel region, and a second gate insulating layer between the second nanowire channel region and the second gate. The second gate may include a second metal layer along the second nanowire channel region and may include a second crystal grain size different from the first crystal grain size.

BRIEF DESCRIPTION OF THE DRAWINGS

Some embodiments will be more clearly understood from the following brief description taken in conjunction with the accompanying drawings. The accompanying drawings represent non-limiting, some embodiments as described herein.

DETAILED DESCRIPTION OF EMBODIMENTS

Figure 1:
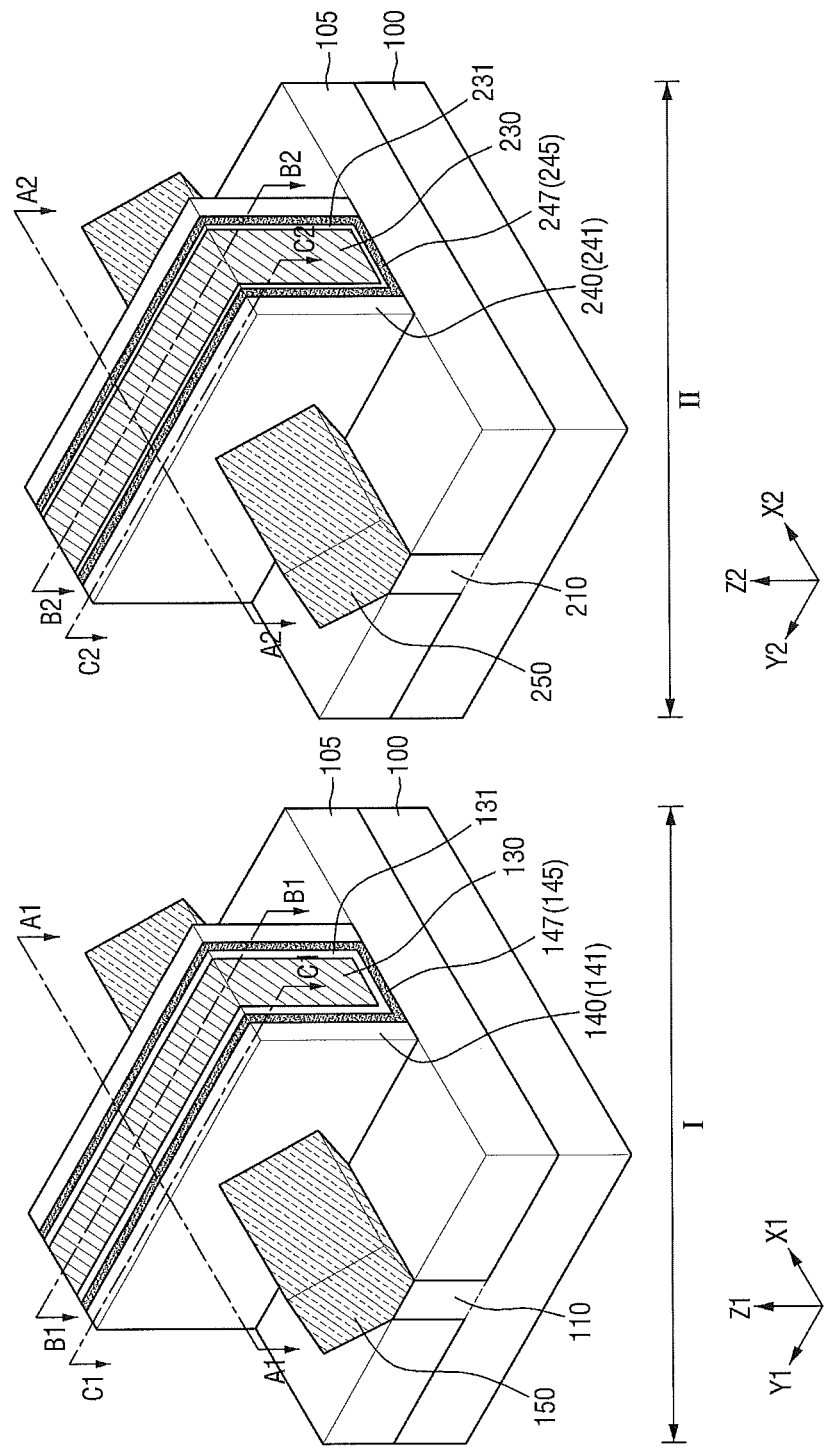
FIG. 1 is a perspective view illustrating a semiconductor device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

The drawings are intended to illustrate the general characteristics of methods, structures and/or materials utilized in certain some embodiments and to supplement the written description provided below. These drawings may not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "connected to" or "on" another element, it can be directly connected to or on the other element or intervening elements may be present. In contrast, the term "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Semiconductor devices according to some embodiments of the inventive concepts will be described with reference to FIGS. 1 to 4.

Figure 2:
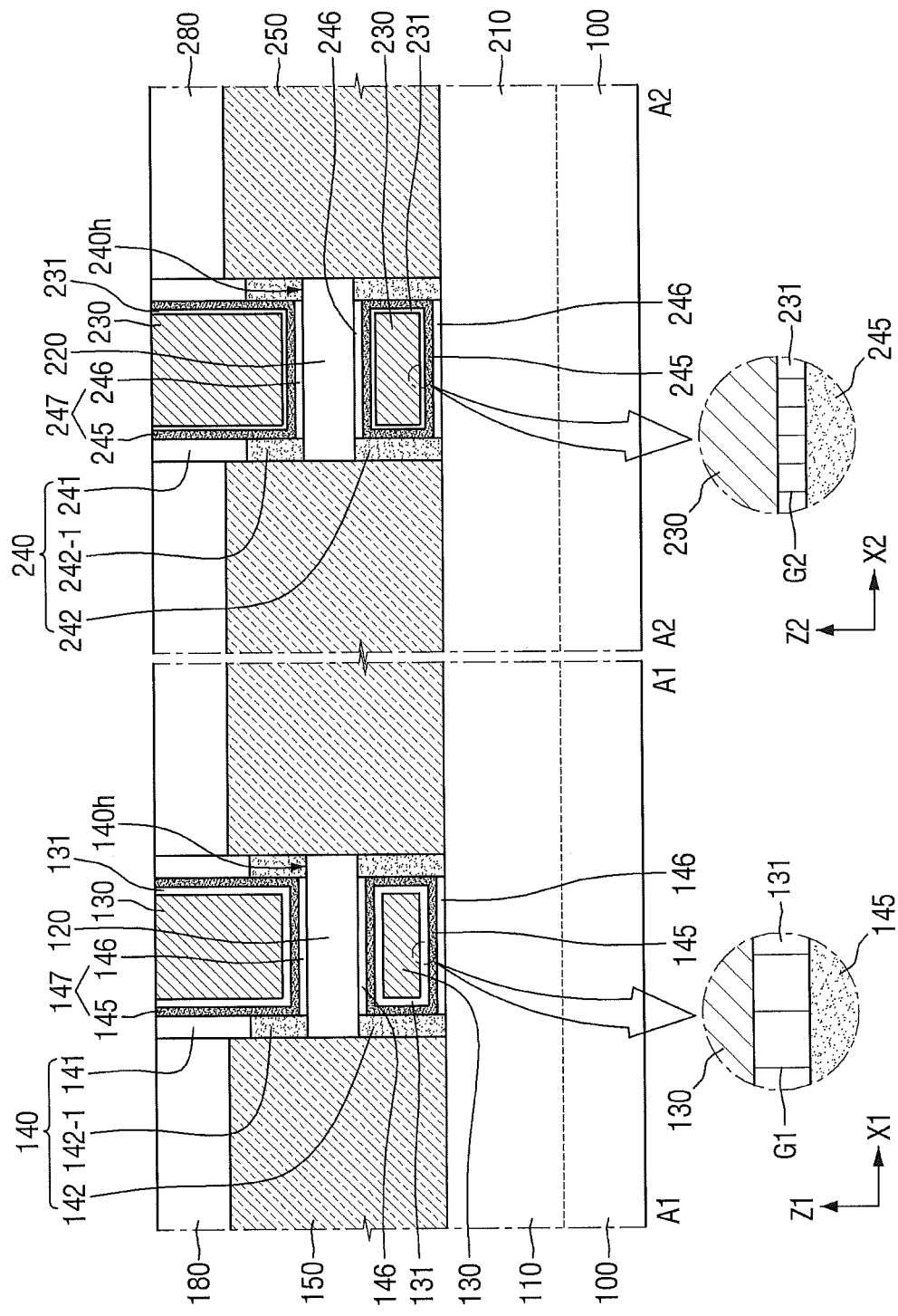
FIG. 2 is a cross-sectional view taken along lines A1-A1 and A2-A2 of FIG. 1, according to some embodiments of the inventive concepts.
Figure 3:
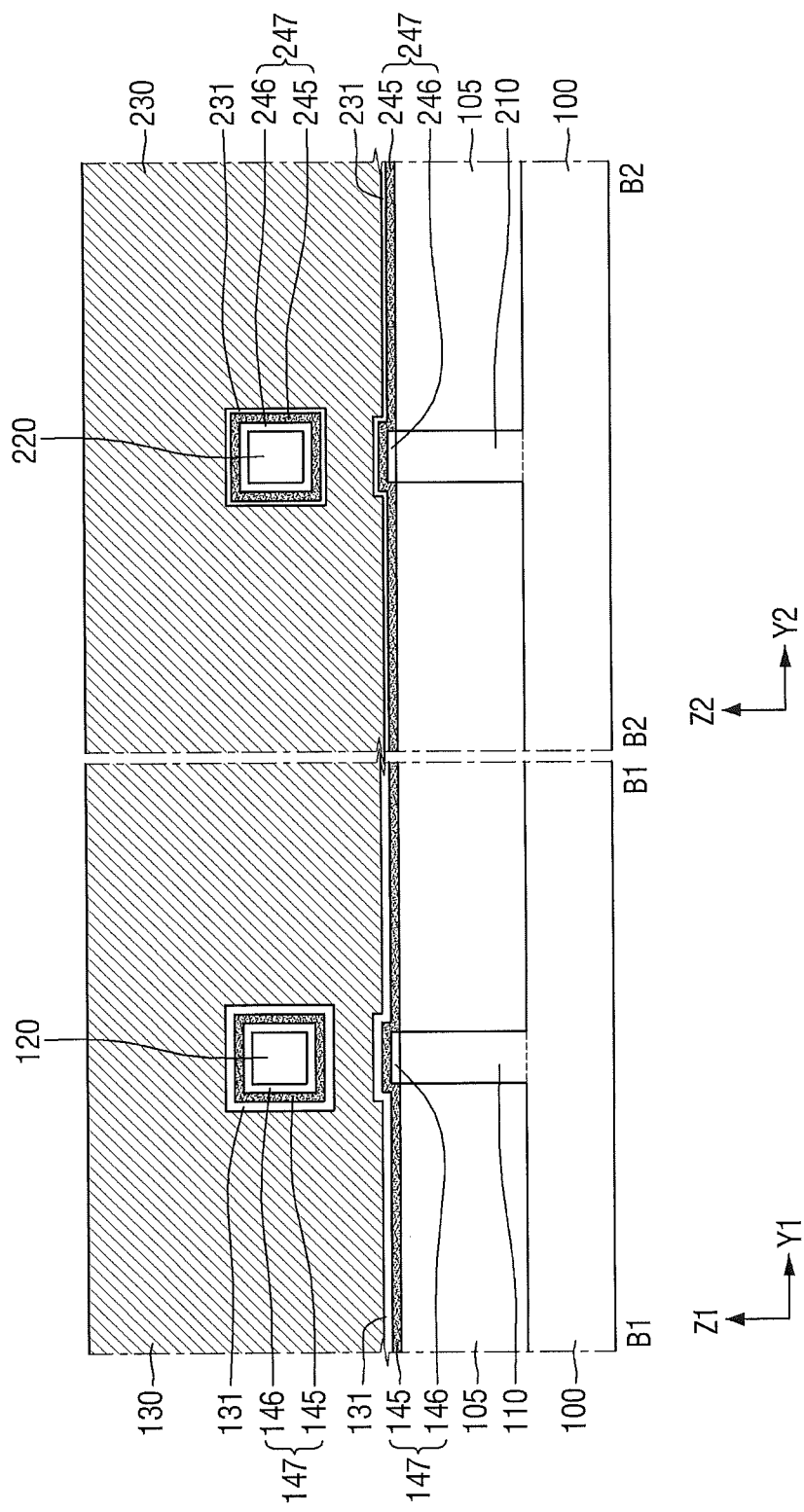
FIG. 3 is a cross-sectional view taken along lines B1-B1 and B2-B2 of FIG. 1, according to some embodiments of the inventive concepts.
Figure 4:
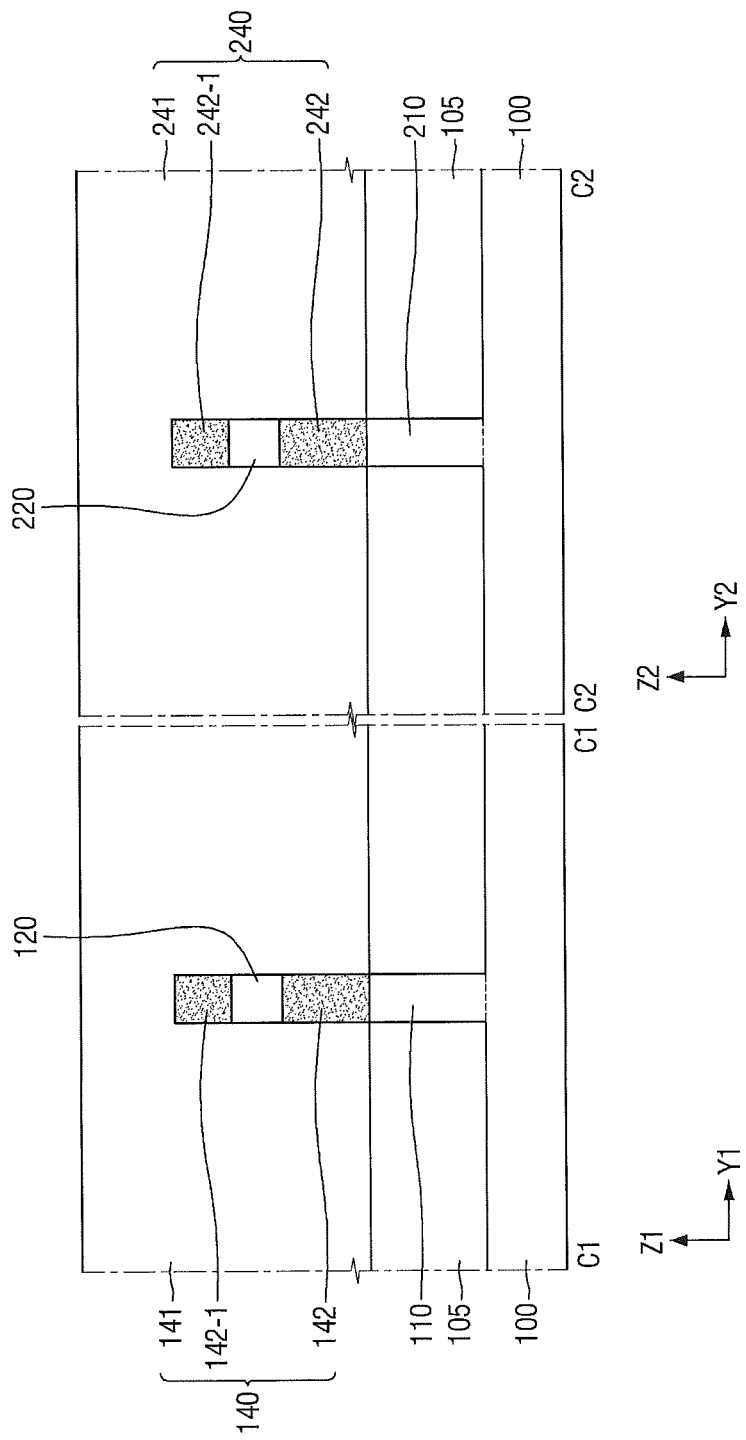
FIG. 4 is a cross-sectional view taken along lines C1-C1 and C2-C2 of FIG. 1, according to some embodiments of the inventive concepts.

FIG. 1 is a perspective view illustrating a semiconductor device according to some embodiments of the inventive concepts. FIG. 2 is a cross-sectional view taken along lines A1-A1 and A2-A2 of FIG. 1. FIG. 3 is a cross-sectional view taken along lines B1-B1 and B2-B2 of FIG. 1. FIG. 4 is a cross-sectional view taken along lines C1-C1 and C2-C2 of FIG. 1.

Referring to FIGS. 1 to 4, a semiconductor device according to some embodiments of the inventive concepts may include a substrate 100 including a first region I and a second region II.

The substrate 100 may include, for example, bulk silicon or silicon-on-insulator (SOI). Alternatively, the substrate 100 may include other substance such as silicon germanium, indium antimonide, lead telluride compound, indium arsenide, indium phosphide, gallium arsenide or gallium antimonide. Alternatively, the substrate 100 may be a base substrate having an epitaxial layer formed thereon.

The first and second regions I and II may be adjacent to or spaced apart from each other on the substrate 100.

The first region I of the substrate 100 may be represented by a first direction X1, a second direction Y1 and a third direction Z1 that are perpendicular to one another. The second region II of the substrate 100 may be represented by a fourth direction X2, a fifth direction Y2 and a sixth direction Z2 that are perpendicular to one another.

The first region I may include a first fin-type pattern 110, a first nanowire 120, a first gate electrode 130, a first gate spacer 140 and a first source/drain 150, and so on.

The first fin-type pattern 110 may be protruded from the substrate 100. The first fin-type pattern 110 may be elongated in the first direction X1. That is, the first fin-type pattern 110 may include a long side extended in the first direction X1, and a short side extended in the second direction Y1.

The first fin-type pattern 110 may be formed by partially etching the substrate 100, or may include an epitaxial layer grown from the substrate 100. The first fin-type pattern 110 may include an element semiconductor material such as silicon or germanium, for example. Further, the first fin-type pattern 110 may include a compound semiconductor such as, for example, IV-IV group compound semiconductor or III-IV group compound semiconductor.

For example, in the case of IV-IV group compound semiconductor, the first fin-type pattern 110 may be a binary compound, a ternary compound including at least two or more of carbon (C), silicon (Si), germanium (Ge) and tin (Sn), or these compound doped with IV group compound.

In the case of III-IV group compound semiconductor, for example, the first fin-type pattern 110 may be a binary compound, a ternary compound or quaternary compound which is formed by combination of at least one III group element selected from, for example, aluminum (Al), gallium (Ga) and indium (In), with one V group element selected from, for example, phosphorus (P), arsenic (As) and antimony (Sb).

In the following description, it is assumed that the first fin-type pattern 110 of a semiconductor device according to example embodiments includes silicon.

A field insulating layer 105 may at least partially surround a sidewall of the first fin-type pattern 110. The first fin-type pattern 110 may be defined by the field insulating layer 105. That is, the substrate 100 and the first fin-type pattern 110 may be distinguished from each other by the field insulating layer 105. The field insulating layer 105 may include, for example, one of an oxide layer, a nitride layer, an oxynitride layer or a combination thereof.

As illustrated FIG. 1, the sidewall of the first fin-type pattern 110 may be completely surrounded by the field insulating layer 105, but note that this is only for illustrative purpose, and example embodiments are not limited thereto.

The first nanowire 120 may be formed on the substrate 100, while being spaced apart from the first fin-type pattern 110. The first nanowire 120 may be extended in the first direction X1. Specifically, the first nanowire 120 may be formed on the first fin-type pattern 110, while being spaced apart from the first fin-type pattern 110.

The first nanowire 120 may be overlapped with the first fin-type pattern 110 in the third direction Z1. The first nanowire 120 may be formed on the first fin-type pattern 110, rather than being formed on the field insulating layer 105.

Although FIG. 3 illustrates that the first nanowire 120 has a square cross section, example embodiments are not limited thereto. It is of course possible that the corner of the first nanowire 120 may be rounded through a trimming process, and so on.

The first nanowire 120 may be used as a channel region for the transistor. Materials for the first nanowire 120 may vary depending on whether a semiconductor device is PMOS or NMOS, but example embodiments are not limited thereto.

Further, the first nanowire 120 may include the same material as that of the first fin-type pattern 110 or include a material different from that of the first fin-type pattern 110. However, for convenience of explanation, it will be assumed herein that the first nanowire 120 of the semiconductor device according to example embodiments may include silicon.

The first gate electrode 130 may be formed on the field insulating layer 105 and the first fin-type pattern 110. The first gate electrode 130 may be extended in the second direction Y1. The first gate electrode 130 may be formed so as to surround a periphery of the first nanowire 120 which is spaced apart from a top surface of the first fin-type pattern 110. The first gate electrode 130 may also be formed in a space defined between the first nanowire 120 and the first fin-type pattern 110.

The first gate electrode 130 may include conductive materials. As illustrated, the first gate electrode 130 may be a single layer, but not limited thereto. That is, the first gate electrode 130 may include a work function control layer which adjusts work function, and a filling conductive layer which fills a space formed by the work function control layer.

The first gate electrode 130 may include, for example, TiN, WN, TaN, Ru, TiC, TaC, Ti, Ag, Al, TiAl, TiAlN, TiAlC, TaCN, TaSiN, Mn, Zr, W and/or Co. Alternatively, the first gate electrode 130 may be formed of a non-metal element such as silicon, silicon germanium, and so on. For example, the first gate electrode 130 described above may be formed by a replacement process, but not limited thereto.

The first gate spacer 140 may be formed on opposite sidewalls of the first gate electrode 130 that is extended in the second direction Y1. The first gate spacer 140 may be formed on opposite sides of the first nanowire 120 while facing each other. As shown FIG. 2, the first gate spacer 140 may each include a through-hole 140h.

The first nanowire 120 may penetrate the first gate spacer 140 through the first through-hole 140h. The first gate spacer 140 may be entirely in contact with a periphery of a portion of the side surface of the first nanowire 120 according to some embodiments. That is, an inner wall of the first through-hole 140h may be in contact with a portion of the outer peripheral surface of the first nanowire 120.

When the corner of the first nanowire 120 surrounded by the first gate electrode 130 is rounded by the process such as trimming, a cross section of the first nanowire 120 in contact with the first gate spacer 140 may be different from a cross section of the first nanowire 120 surrounded by the first gate electrode 130.

The first gate spacer 140 may include a first outer spacer 141, a first inner spacer 142 and a second inner spacer 142-1. The first outer spacer 141 may be in direct contact with the first inner spacer 142 and the second inner spacer 142-1. The first inner spacer 142 may be disposed between the first fin-type pattern 110 and the first nanowire 120, and may be in surface contact with the top surface of the first fin-type pattern 110. The second inner spacer 142-1 may be disposed on the top surface of the first nanowire 120, and may be surrounded by the first outer spacer 141.

On an Y1-Z1 cross section, the first inner spacer 142 may be surrounded by the first nanowire 120, the first outer spacer 141 and the first fin-type pattern 110.

On the Y1-Z1 cross section, the second inner spacer 142-1 may be surrounded by the first nanowire 120 and the first outer spacer 141.

The first through-hole 140h of the first gate spacer 140 may be defined by the first outer spacer 141, the first inner spacer 142 and the second inner spacer 142-1. An end of the first nanowire 120 may be in contact with the first outer spacer 141, the first inner spacer 142 and the second inner spacer 142-1.

The first inner spacer 142 and the second inner spacer 142-1 may have the same material as each other. The first outer spacer 141 may have a material different from that of the first inner spacer 142 and the second inner spacer 142-1. That is, when a dielectric constant of the material included in the first outer spacer 141 is a first dielectric constant and a dielectric constant of the material included in the first inner spacer 142 is a second dielectric constant, the first dielectric constant and the second dielectric constant may be different from each other.

According to some example embodiments, the material included in the first outer spacer 141 may have a first dielectric constant that is greater than a second dielectric constant of the material included in the first inner spacer 142 and the second inner spacer 142-1. It is possible to reduce a fringing capacitance between the first gate electrode 130 and the first source/drain 150 by having the second dielectric constant lower than the first dielectric constant.

The first outer spacer 141 may include, for example, silicon nitride (SiN), silicon oxynitride (SiON), silicon oxide ($SiO_2$), silicon oxycarbidenitride (SiOCN), and/or a combination thereof. For example, the first inner spacer 142 and the second inner spacer 142-1 may include a low-k dielectric material, silicon nitride (SiN), silicon oxynitride (SiON), silicon oxide ($SiO_2$), silicon oxycarbidenitride (SiOCN), and/or a combination thereof. The low-k dielectric material may have a lower dielectric constant than the silicon oxide.

A first gate insulating layer 147 may be formed between the first nanowire 120 and the first gate electrode 130. Further, the first gate insulating layer 147 may also be formed between the field insulating layer 105 and the first gate electrode 130, and between the first and second inner spacers 142 and 142-1 and the first gate electrode 130.

For example, the first gate insulating layer 147 may include a first interfacial layer 146 and a first high-k insulating layer 145, but is not limited thereto. That is, the first interfacial layer 146 of the first gate insulating layer 147 may be omitted depending on a material of the first nanowire 120, and so on.

Since the first interfacial layer 146 may be formed on a periphery of the first nanowire 120, the first interfacial layer 146 may be formed between the first nanowire 120 and the first gate electrode 130, and between the first fin-type pattern 110 and the first gate electrode 130.

When the first nanowire 120 includes silicon, the first interfacial layer 146 may include a silicon oxide layer. The first interfacial layer 146 may be formed on the periphery of the first nanowire 120, but not formed along the sidewalls of the first inner spacer 142, the second inner spacer 142-1 and the first outer spacer 141.

On the other hand, the first high-k insulating layer 145 may be formed between the first nanowire 120 and the first gate electrode 130, between the first inner spacer 142 and the first gate electrode 130, between the second inner spacer 142-1 and the first gate electrode 130, between the field insulating layer 105 and the first gate electrode 130, and between the first outer spacer 141 and the first gate electrode 130.

The first high-k insulating layer 145 may include a high-k dielectric material having a higher dielectric constant than a silicon oxide layer. For example, the high-k dielectric material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, and/or lead zinc niobate, but is not limited thereto.

As described above, when the first interfacial layer 146 is omitted, the first high-k insulating layer 145 may include not only the high-k dielectric material, but also silicon oxide, silicon oxynitride, silicon nitride, and so on.

The first gate insulating layer 147 may be formed along the periphery of the first nanowire 120. The first gate insulating layer 147 may be formed along the top surface of the field insulating layer 105 and the top of the first fin-type pattern 110. In addition, the first gate insulating layer 147 may be formed along the sidewalls of the first inner spacer 142, the second inner spacer 142-1 and the first outer spacer 141.

A first metal layer 131 may be formed on the first gate insulating layer 147. The first metal layer 131 may surround the periphery of the first nanowire 120. The first metal layer 131 may be formed between the first gate electrode 130 and the first gate insulating layer 147. Specifically, the first metal layer 131 may be formed between the first gate electrode 130 and the first high-k insulating layer 145. The first metal layer 131 may include first crystal grains G1 therein. The first metal layer 131 may have a first crystal grain size. As used herein, crystal grain size may refer to a measure of an average size of crystal grains. Thus, the first crystal grain size may refer to an average size of the first crystal grains G1.

Like the first high-k insulating layer 145, the first metal layer 131 may be formed between the first nanowire 120 and the first gate electrode 130, between the first inner spacer 142 and the first gate electrode 130, between the second inner spacer 142-1 and the first gate electrode 130, between the field insulating layer 105 and the first gate electrode 130, and between the first outer spacer 141 and the first gate electrode 130.

The first source/drain 150 may be formed at opposite sides of the first gate electrode 130. The first source/drain 150 may be formed on the first fin-type pattern 110. The first source/drain 150 may include an epitaxial layer that is formed on a top surface of the first fin-type pattern 110.

An outer circumference of the first source/drain 150 may take a variety of shapes. For example, the outer circumference of the first source/drain 150 may, in some embodiments, include a diamond, circle, rectangular and/or octagon shape. FIG. 1 illustrates a diamond shape (or pentagon or hexagon shape) for an example.

The first source/drain 150 may be directly connected with the first nanowire 120 which is used as the channel region. That is, the first source/drain 150 may be directly connected with the first nanowire 120 that penetrates the first through-hole 140h of the first gate spacer 140.

However, the first source/drain 150 may not be in direct contact with the first gate insulating layer 147. The first gate spacer 140 may be positioned between the first source/drain 150 and the first gate insulating layer 147. More specifically, one of sidewalls of the first inner spacer 142 and the second inner spacer 142-1 may be in contact with the first gate insulating layer 147, while other sidewalls of the first inner spacer 142 and the second inner spacer 142-1 may be in contact with the first source/drain 150. Thus, the first source/drain 150 and the first gate insulating layer 147 may not be in contact with each other between the first nanowire 120 and the substrate 100. Further, since the first outer spacer 141 is in contact with an uppermost portion of the first nanowire 120, the first source/drain 150 and the first gate insulating layer 147 may not be in contact with each other on the first nanowire 120.

A first interlayer insulating layer 180 may be formed on the first source/drain 150, the first gate spacer 140 and the field insulating layer 105.

The first interlayer insulating layer 180 may include a low-k dielectric material, an oxide layer, a nitride layer and/or an oxynitride layer. The low-k dielectric material may include, for example, flowable oxide (FOX), tonen silazen (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD) oxide, and/or a combination thereof.

A device that is similar to the device formed on the first region I may be formed on the second region II. Specifically, the second region II may include a second fin-type pattern 210, a second nanowire 220, a second gate electrode 230, a second gate spacer 240 and a second source/drain 250. The second fin-type pattern 210, the second nanowire 220, the second gate electrode 230, the second gate spacer 240 and the second source/drain 250 may respectively have substantially the same characteristics as the first fin-type pattern 110, the first nanowire 120, the first gate electrode 130, the first gate spacer 140 and the first source/drain 150 which are described above.

Further, a second interlayer insulating layer 280, a second through-hole 240h, a second interfacial layer 246, a second high-k insulating layer 245, a third inner spacer 242, a fourth inner spacer 242-1 and a second outer spacer 241 may respectively have substantially the same characteristics as the first interlayer insulating layer 180, the first through-hole 140h, the first interfacial layer 146, the first high-k insulating layer 145, the first inner spacer 142, the second inner spacer 142-1 and the first outer spacer 141.

Accordingly, for convenience of explanation, differences between the first region I and the second region II will be mainly explained below.

A second metal layer 231 may be formed on a top surface of a second gate insulating layer 247. The second metal layer 231 may surround a periphery of the second nanowire 220. The second metal layer 231 may be formed between the second gate electrode 230 and the second gate insulating layer 247. Specifically, the second metal layer 231 may be formed between the second gate electrode 230 and the second high-k insulating layer 245.

The second metal layer 231 may include second crystal grains G2 therein. The second metal layer 231 may have a second crystal grain size. The second crystal grain size may refer to an average size of the second crystal grains G2.

Like the second high-k insulating layer 245, the second metal layer 231 may be formed between the second nanowire 220 and the second gate electrode 230, between the third inner spacer 242 and the second gate electrode 230, between the fourth inner spacer 242-1 and the second gate electrode 230, between the field insulating layer 105 and the second gate electrode 230, and between the second outer spacer 241 and the second gate electrode 230.

The second crystal grain size of the second metal layer 231 may be smaller than the first crystal grain size of the first metal layer 131. That is, the average size of the second crystal grains G2 may be smaller than the average size of the first crystal grains G1. Although the first crystal grains G1 and the second crystal grains G2 are shown as a rectangular shape in FIG. 2, one will understand that this is only for convenience of explanation and the shapes of the crystal grains are not limited thereto. Due to a size difference between the first crystal grain G1 and the second crystal grain G2, the first metal layer 131 and the second metal layer 231 may respectively apply different characteristic stress to the first nanowire 120 and the second nanowire 220. That is, the first metal layer 131 may apply tensile stress to the first nanowire 120. The second metal layer 231 may apply compressive stress to the second nanowire 220. This may be due to a difference in a lattice constant between the first nanowire 120 and the first metal layer 131 and between the second nanowire 220 and the second metal layer 231.

The first metal layer 131 and the second metal layer 231 may be formed by a selective growth method. Accordingly, the first metal layer 131 and the second metal layer 231 may respectively have a different crystal grain size. Although the crystal grain size of the first metal layer 131 and the crystal grain size of the second metal layer 231 are different from each other, the first metal layer 131 and the second metal layer 231 may include the same material as each other. For example, the first metal layer 131 and the second metal layer 231 may all include tungsten (W).

In some embodiments, the first region I may be a NMOS region, and the second region II may be a PMOS region. That is, a transistor formed in the first region I may be a NMOS transistor, and a transistor formed in the second region II may be a PMOS transistor. The first nanowire 120 may serve as a channel region for the NMOS transistor. The second nanowire 220 may serve as a channel region for the PMOS transistor.

The first metal layer 131 may apply a compressive stress to the first nanowire 120, referred to as a channel region of the NMOS transistor, to enhance carrier (electron) mobility in the channel region. In contrast, the second metal layer 231 may apply a tensile stress to the second nanowire 220, referred to as a channel region of the PMOS transistor, to enhance carrier (hole) mobility in the channel region. That is, it is desired to use stress engineering techniques at a position of the gate electrode in order to induce higher stress levels in the channel region for carrier mobility enhancement.

In some embodiments of the inventive concepts, a new metal layer may be added between the gate electrode and the channel region to enhance the carrier mobility.

In FIG. 2, although the first metal layer 131 is thicker than that of the second metal layer 231, embodiments are not limited thereto. In some embodiments, the first metal layer 131 and the second metal layer 231 may have substantially the same thickness as each other.

Hereinafter, a semiconductor device according to some embodiments of the inventive concepts will be explained with reference to FIGS. 1 and 5 to 7.

Figure 5:
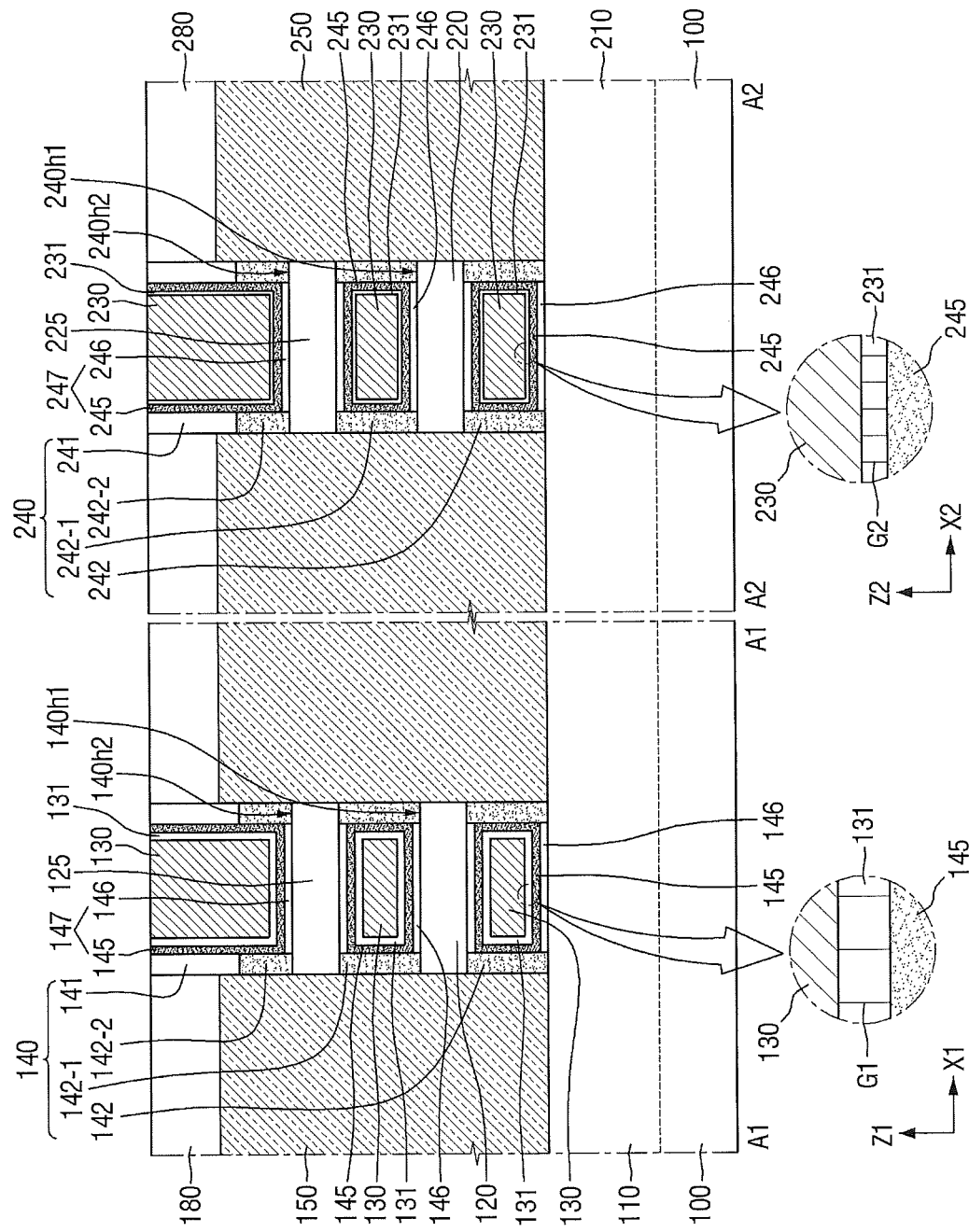
FIGS. 5 to 7 are cross-sectional views illustrating a semiconductor device according to some embodiments of the inventive concepts.
Figure 6:
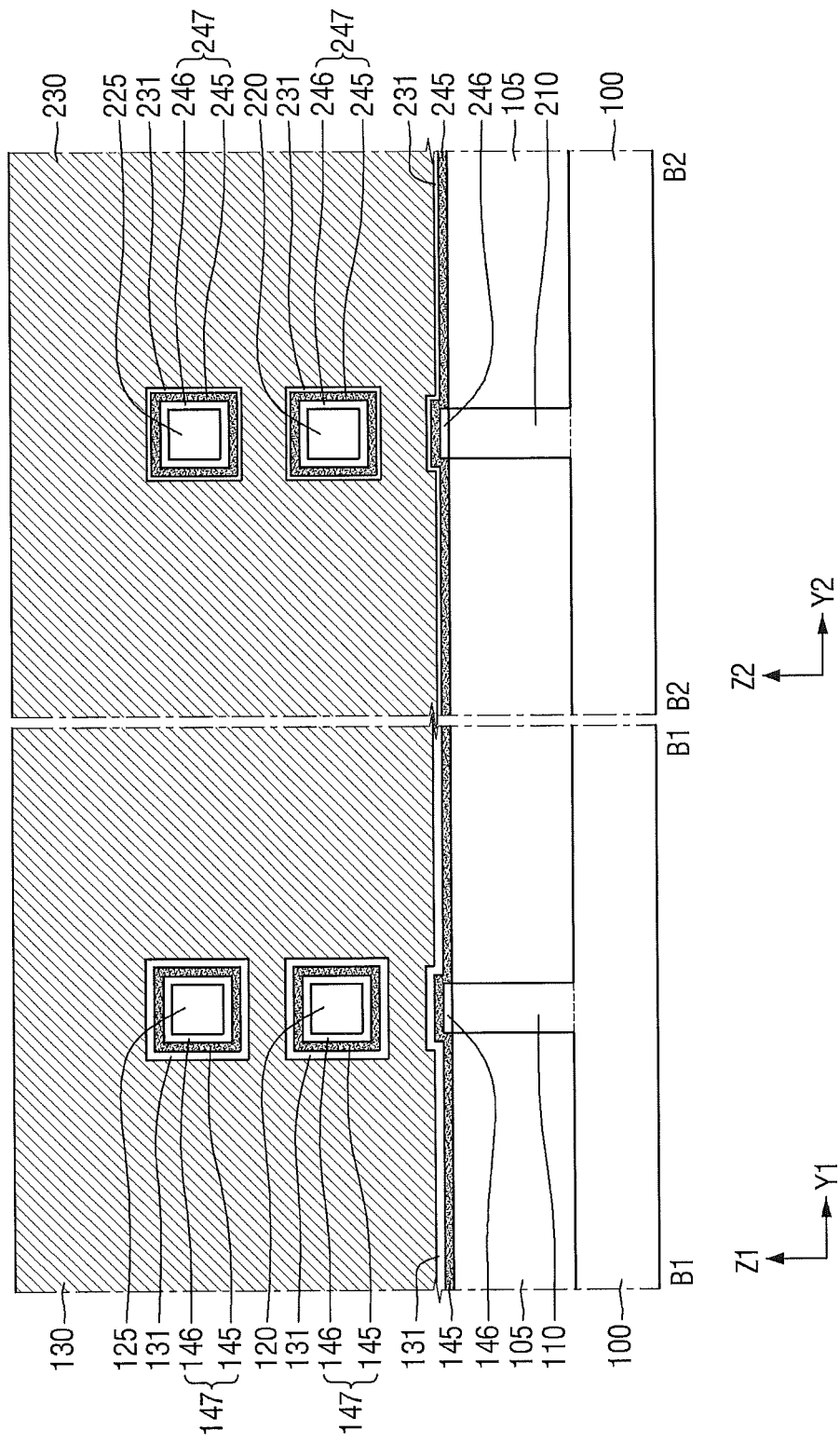
Figure 7:
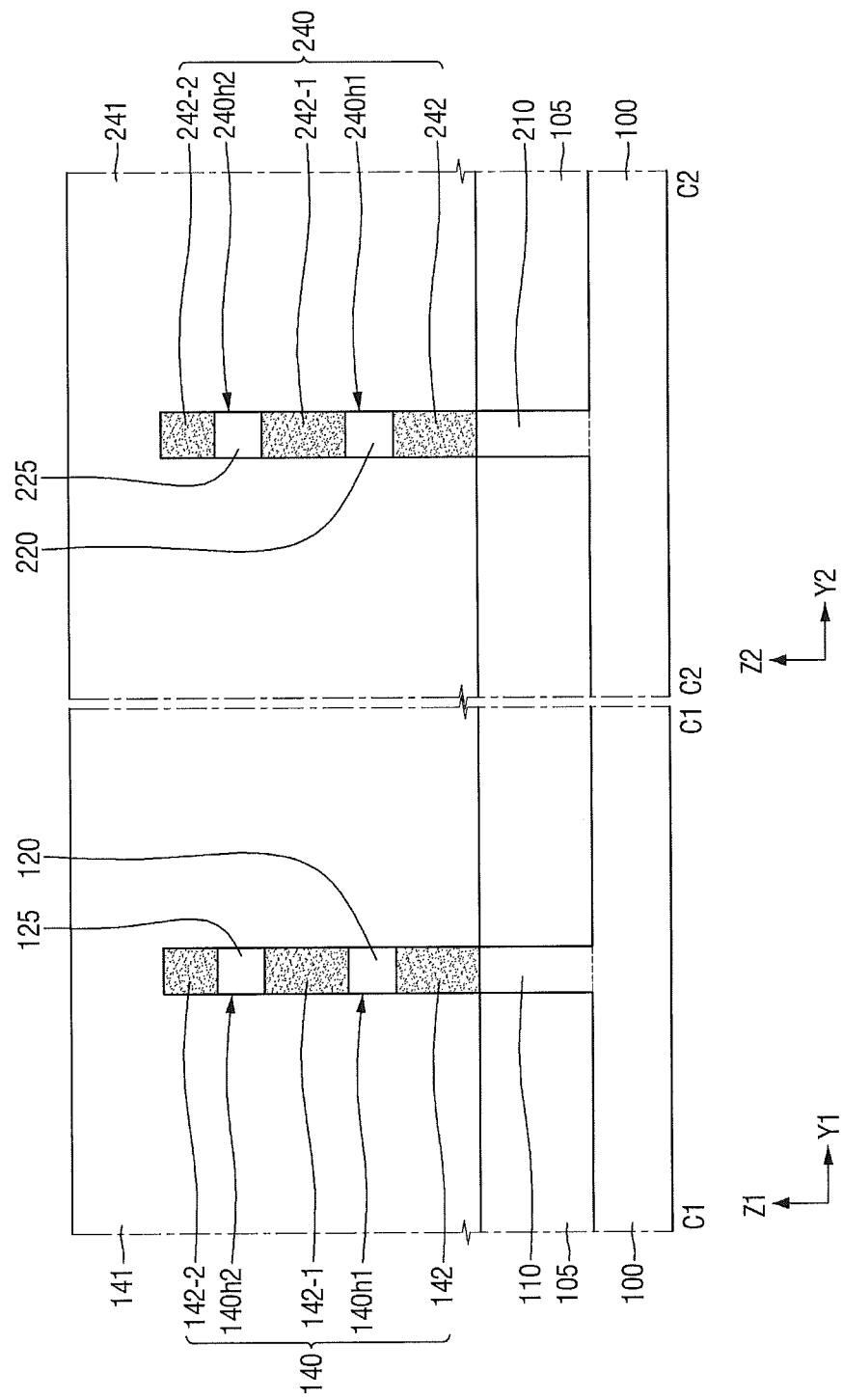

FIGS. 5 to 7 are cross-sectional views illustrating a semiconductor device according to some embodiments of the inventive concepts. For reference, FIG. 5 is a cross-sectional view taken along lines A1-A1 and A2-A2 of FIG. 1. FIG. 6 is a cross-sectional view taken along lines B1-B1 and B2-B2 of FIG. 1. FIG. 7 is a cross-sectional view taken along lines C1-C1 and C2-C2 of FIG. 1. Note that FIGS. 1 and 5 to 7 may be illustrated in different scales from one another. Semiconductor devices according to FIGS. 5 to 7 may be similar to the semiconductor devices described above with respect to FIGS. 1 through 4 except for the differences described below. Reference numerals the same as or similar to those described with respect to the foregoing figures may represent the same or similar elements, and descriptions thereof may be omitted or briefly described in the following description in order to simplify the description.

Referring to FIGS. 1 and 5 to 7, a semiconductor device according to some embodiments of the inventive concepts may further include a third nanowire 125 and a fourth nanowire 225.

The third nanowire 125 may be formed on the substrate 100, while being spaced apart from the substrate 100. The third nanowire 125 may be extended in the first direction X1.

The third nanowire 125 may be farther spaced apart from substrate 100 than the first nanowire 120. That is, a height from the top surface of the first fin-type pattern 110 to the third nanowire 125 may be greater than a height from the top surface of the first fin-type pattern 110 to the first nanowire 120.

The third nanowire 125 may be overlapped with the first fin-type pattern 110. The third nanowire 125 may be formed on the first fin-type pattern 110 rather than being formed on the field insulating layer 105.

The third nanowire 125 may be used as a channel region for a transistor. Thus, the third nanowire 125 may include the same material as that of the first nanowire 120.

The first gate electrode 130 may be formed so as to surround a periphery of the third nanowire 125. The first gate electrode 130 may also be formed in a space that is defined between the first nanowire 120 and the third nanowire 125.

The first gate spacer 140 may be disposed on both ends of the first nanowire 120 and on both ends of the third nanowire 125. The first gate spacer 140 may include a plurality of first through-holes 140h1 and 140h2.

The third nanowire 125 may penetrate the first gate spacer 140. The third nanowire 125 may penetrate one of the plurality of first through-holes 140h1 and 140h2. A periphery of the end of the third nanowire 125 may be entirely in contact with the first gate spacer 140.

Like the first nanowire 120, when a corner of the third nanowire 125 surrounded by the first gate electrode 130 may be rounded by a process such as trimming, and so on, the end of the third nanowire 125 being in contact with the first gate spacer 140 have a cross section different from that of the third nanowire 125 surrounded by the first gate electrode 130.

The third nanowire 125 may be aligned with the first nanowire 120. The third nanowire 125 may be overlapped with the first nanowire 120 in the third direction Z1. The first nanowire 120 and the third nanowire 125 may have the same length as each other in the first direction X1. However, embodiments are not limited thereto.

The first inner spacer 142 may be disposed between the top surface of the first fin-type pattern 110 and the first nanowire 120. The second inner spacer 142-1 may be disposed between the first nanowire 120 and the third nanowire 125. A fifth inner spacer 142-2 may be disposed between the third nanowire 125 and the first outer spacer 141.

In the second region II, the fourth nanowire 225 and a sixth inner spacer 242-2 may be added to the semiconductor device illustrated in FIGS. 2 to 4. That is, the fourth nanowire 225 and the sixth inner spacer 242-2 may be the same as the third nanowire 125 and the fifth inner spacer 142-2 of the first region I, respectively.

The first metal layer 131 may be formed on the top surface of the first high-k insulating layer 145 on the third nanowire 125. The first metal layer 131 may surround a periphery of the third nanowire 125. Like the first metal layer 131, the second metal layer 231 may be formed on a top surface of a second high-k insulating layer 245 on the fourth nanowire 225. The second metal layer 231 may surround a periphery of the fourth nanowire 225.

The first source/drain 150 may be directly connected with the third nanowire 125 which is used as the channel region. That is, the first source/drain 150 may be directly connected with the first nanowire 120 and the third nanowire 125 that penetrate the first through-holes 140h1 and 140h2 of the first gate spacer 140. Like the first source/drain 150, the second source/drain 250 may be directly connected with the second nanowire 220 and the fourth nanowire 225 that penetrate the second through-holes 240h1 and 240h2 of the second gate spacer 240.

Hereinafter, a semiconductor device according to some embodiments of the inventive concepts will be explained with reference to FIGS. 8 and 9.

Figure 8:
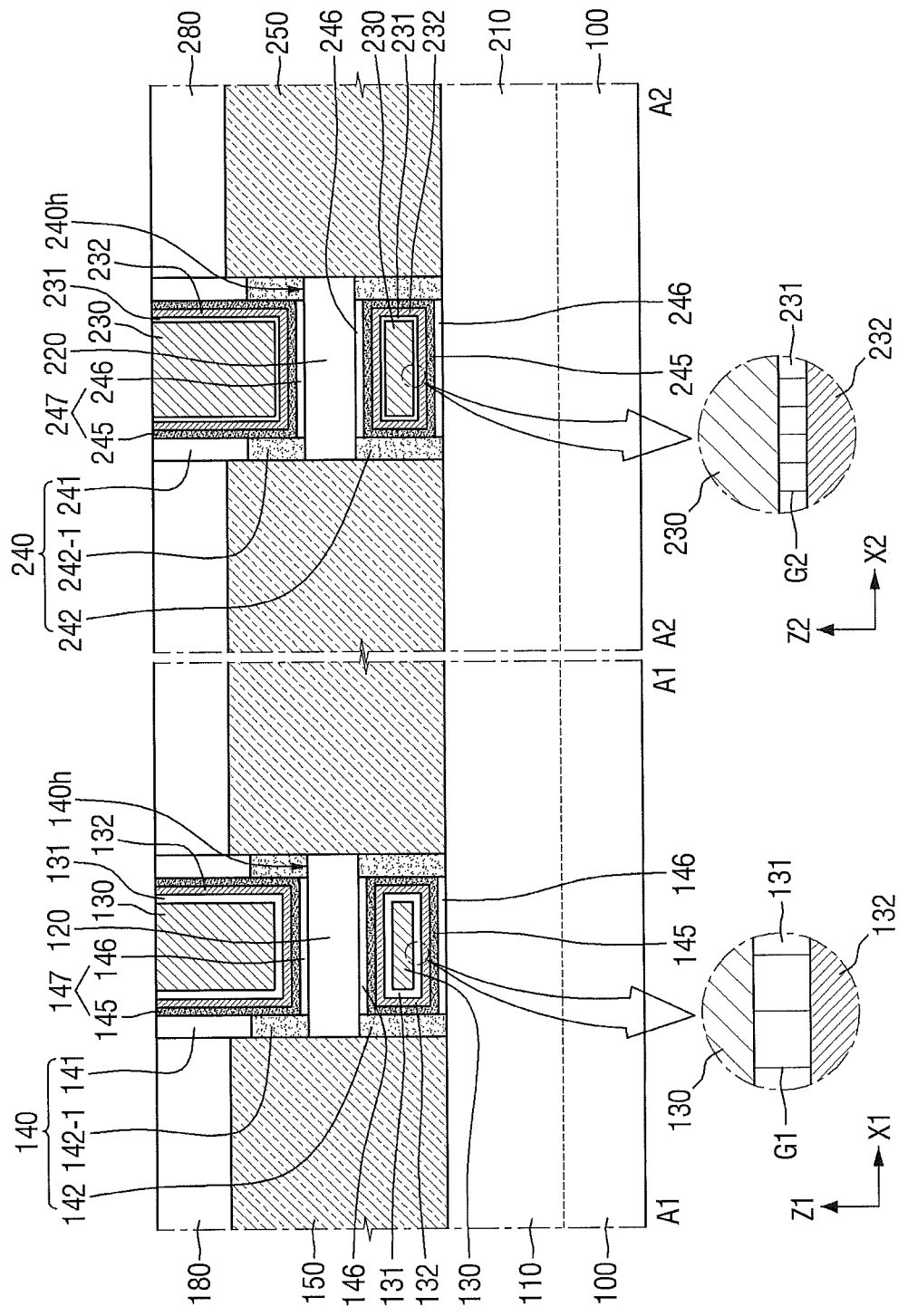
FIGS. 8 to 9 are cross-sectional views illustrating a semiconductor device according to some embodiments of the inventive concepts.
Figure 9:
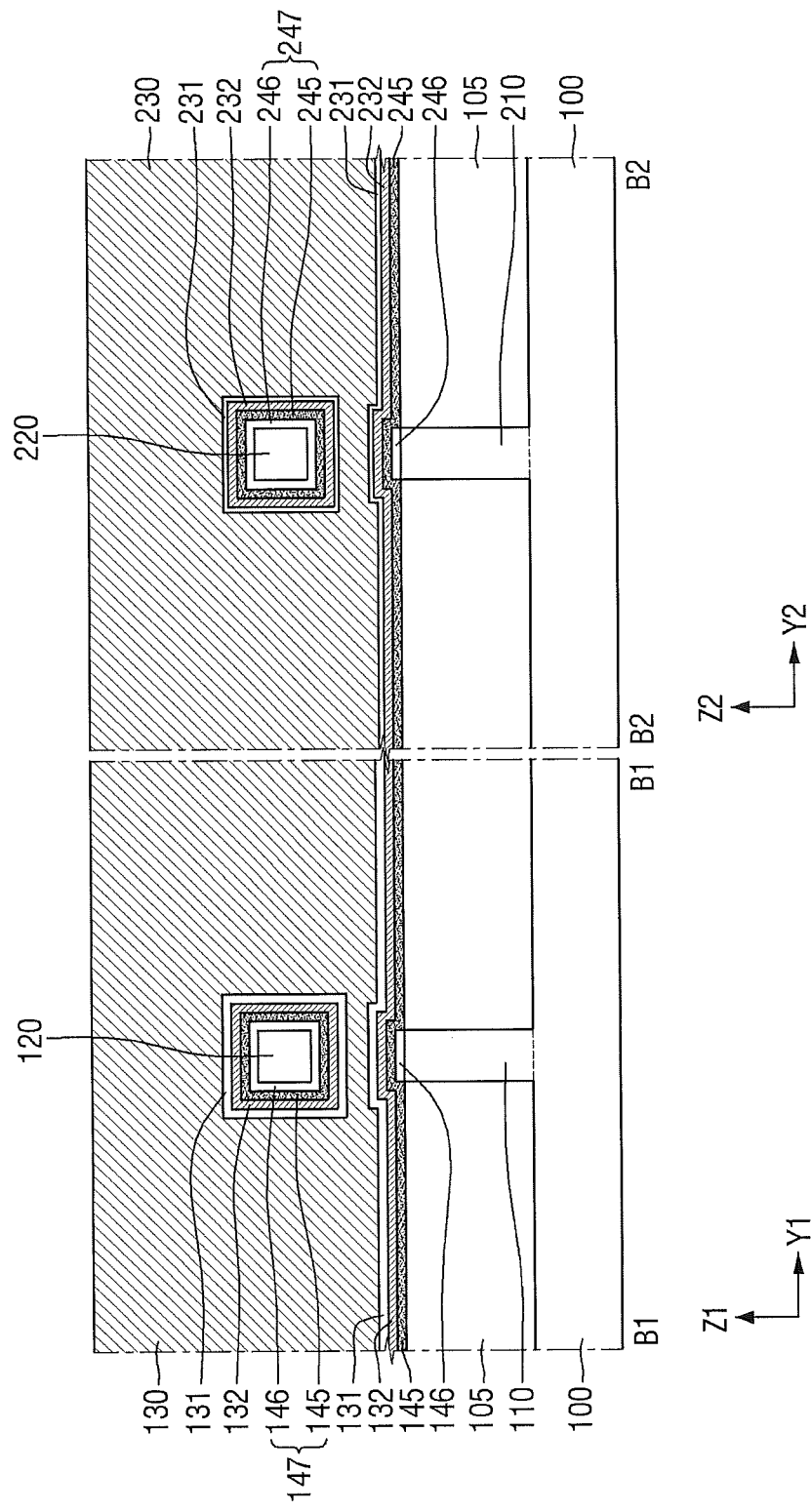

FIGS. 8 to 9 are cross-sectional views illustrating a semiconductor device according to some embodiments of the inventive concepts. Semiconductor devices according to FIGS. 8 to 9 may be similar to the semiconductor devices described above with respect to FIGS. 1 through 4 except for the differences described below. Reference numerals the same as or similar to those described with respect to the foregoing figures may represent the same or similar elements, and descriptions thereof may be omitted or briefly described in the following description in order to simplify the description.

Referring to FIGS. 8 to 9, unlike the semiconductor device illustrated in FIGS. 1 to 4, some embodiments may further include a first barrier metal 132 and a second barrier metal 232. The first barrier metal 132 may be conformally formed between the first metal layer 131 and the first high-k insulating layer 145. The second barrier metal 232 may be conformally formed between the second metal layer 231 and the second high-k insulating layer 245.

The first barrier metal 132 and the second barrier metal 232 may be formed in order to form the first metal layer 131 and the second metal layer 231, respectively. That is, in order to grow the first metal layer 131 and the second metal layer 231, a material having a bonding force on a surface may be used according to some embodiments. Thus, the first barrier metal 132 and the second barrier metal 232 may be first formed, and then, the first metal layer 131 and the second metal layer 231 may be formed thereon.

The first barrier metal 132 and the second barrier metal 232 may include, for example, titanium (Ti) and/or titanium nitride (TiN). In some embodiments, the first barrier metal 132 and the second barrier metal 232 may be a double layer including a titanium nitride (TiN) layer and a tungsten (W) nucleation layer that are formed prior to depositing a bulk tungsten layer.

Hereinafter, a semiconductor device according to some embodiments of the inventive concepts may be explained with reference to FIGS. 10 and 11.

Figure 10:
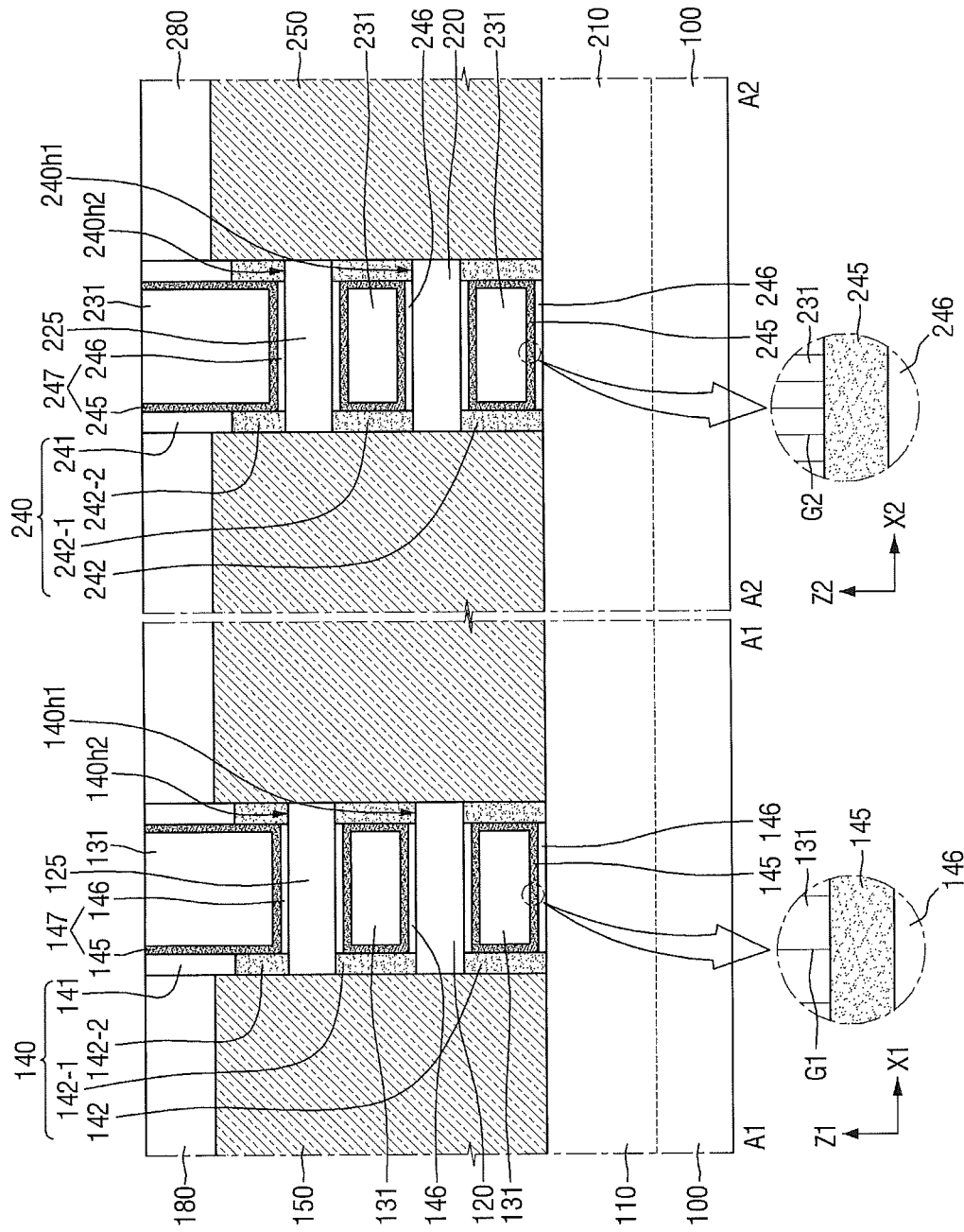
FIGS. 10 to 11 are cross-sectional views illustrating a semiconductor device according to some embodiments of the inventive concepts.
Figure 11:
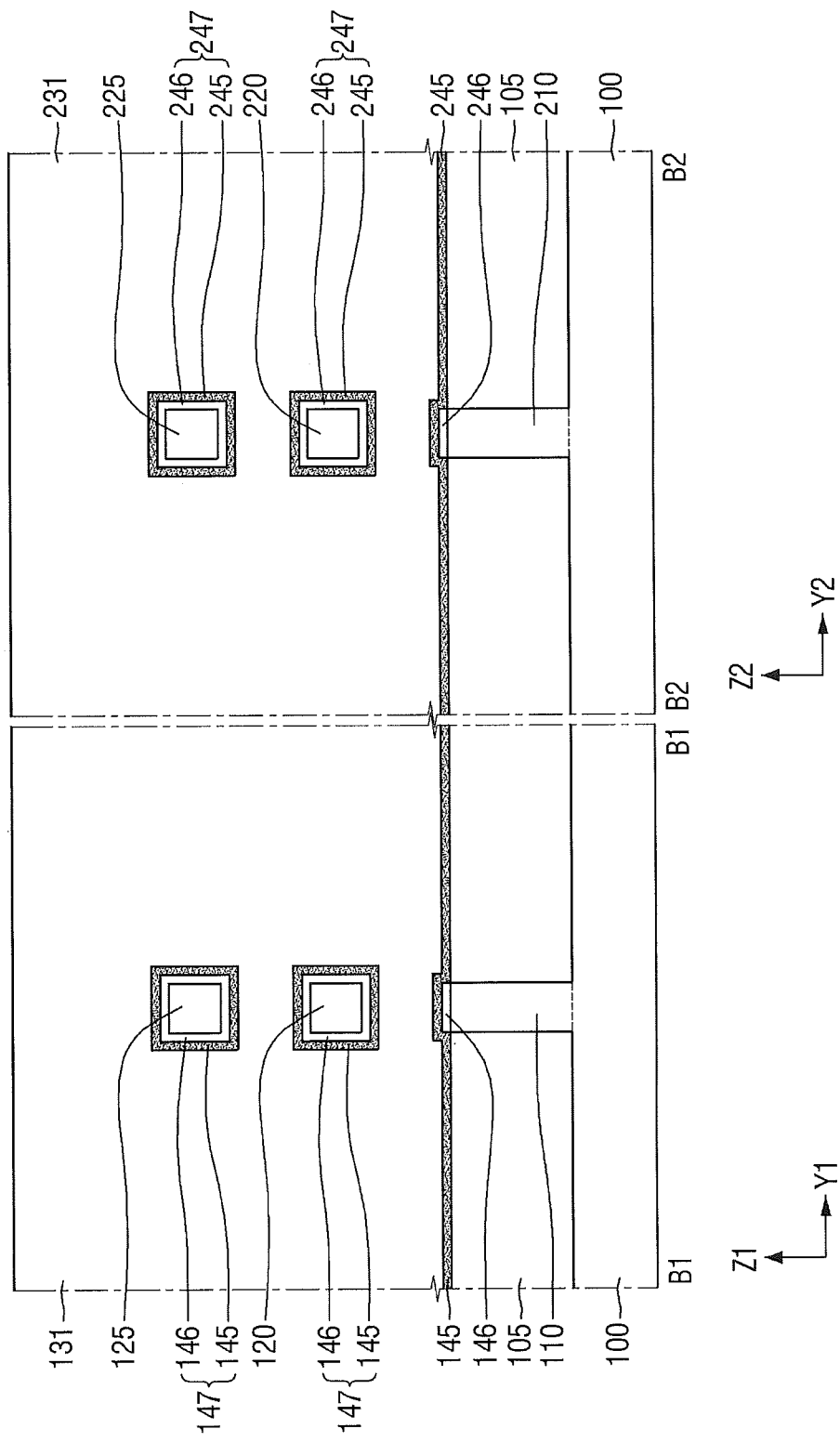

FIGS. 10 to 11 are cross-sectional views illustrating a semiconductor device according to some embodiments of the inventive concepts. Semiconductor devices according to FIGS. 10 to 11 may be similar to the semiconductor devices described above with respect to FIGS. 5 through 7 except for the differences described below. Reference numerals the same as or similar to those described with respect to the foregoing figures may represent the same or similar elements, and descriptions thereof may be omitted or briefly described in the following description in order to simplify the description.

Referring to FIGS. 10 and 11, unlike the semiconductor device illustrated in FIGS. 5 to 7, the first metal layer 131 and the second metal layer 231 instead of the first gate electrode 130 and the second gate electrode 230 illustrated in FIG. 5 may be used as gate electrodes completely surrounding the first to fourth nanowires 120, 220, 125 and 225. That is, each of the first metal layer 131 and the second metal layer 231 may completely fill regions where the gate electrodes will be formed. In this case, each of the first metal layer 131 and the second metal layer 231 may be referred as a fill metal instead of the first gate electrode 130 and the second gate electrode 230 illustrated in FIG. 5.

That is, the first metal layer 131 may be formed between the first nanowire 120 and the first fin-type pattern 110, between the first nanowire 120 and the third nanowire 125, and on the third nanowire 125. The second metal layer 231 may be formed between the second nanowire 220 and the second fin-type pattern 210, between the second nanowire 220 and the fourth nanowire 225, and on the fourth nanowire 225.

The first metal layer 131 and the second metal layer 231 may be used as gate electrodes in the first region I and the second region II, respectively. That is, in some embodiments, the gate electrodes that are formed of a material having a different crystal grain size may apply each different characteristic stress to the channel regions. Thus, an operation characteristic of a semiconductor device may be greatly improved by enhancing carrier mobility.

Hereinafter, a semiconductor device according to some embodiments of the inventive concepts may be explained with reference to FIGS. 12 and 13.

Figure 12:
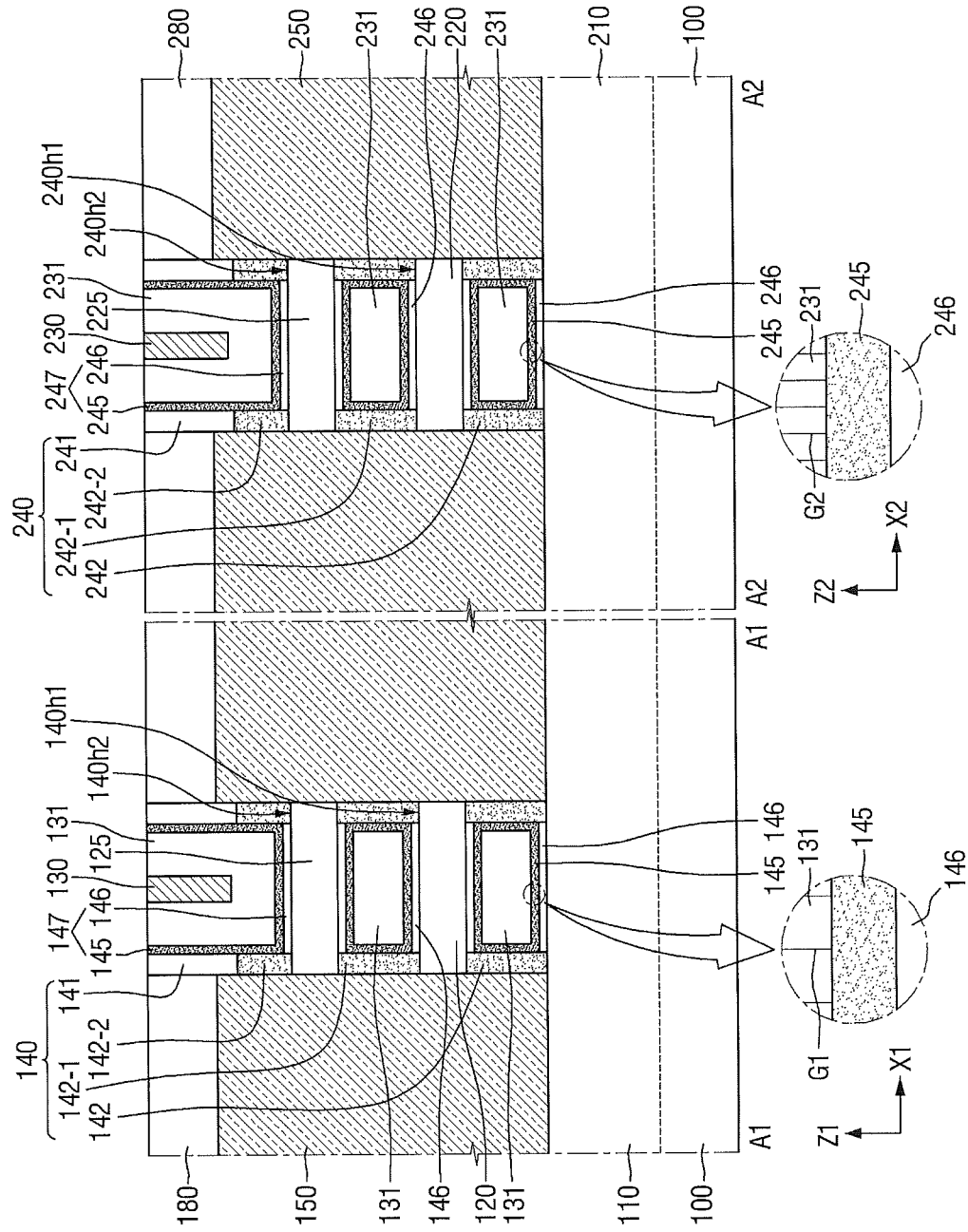
FIGS. 12 to 13 are cross-sectional views illustrating a semiconductor device according to some embodiments of the inventive concepts.
Figure 13:
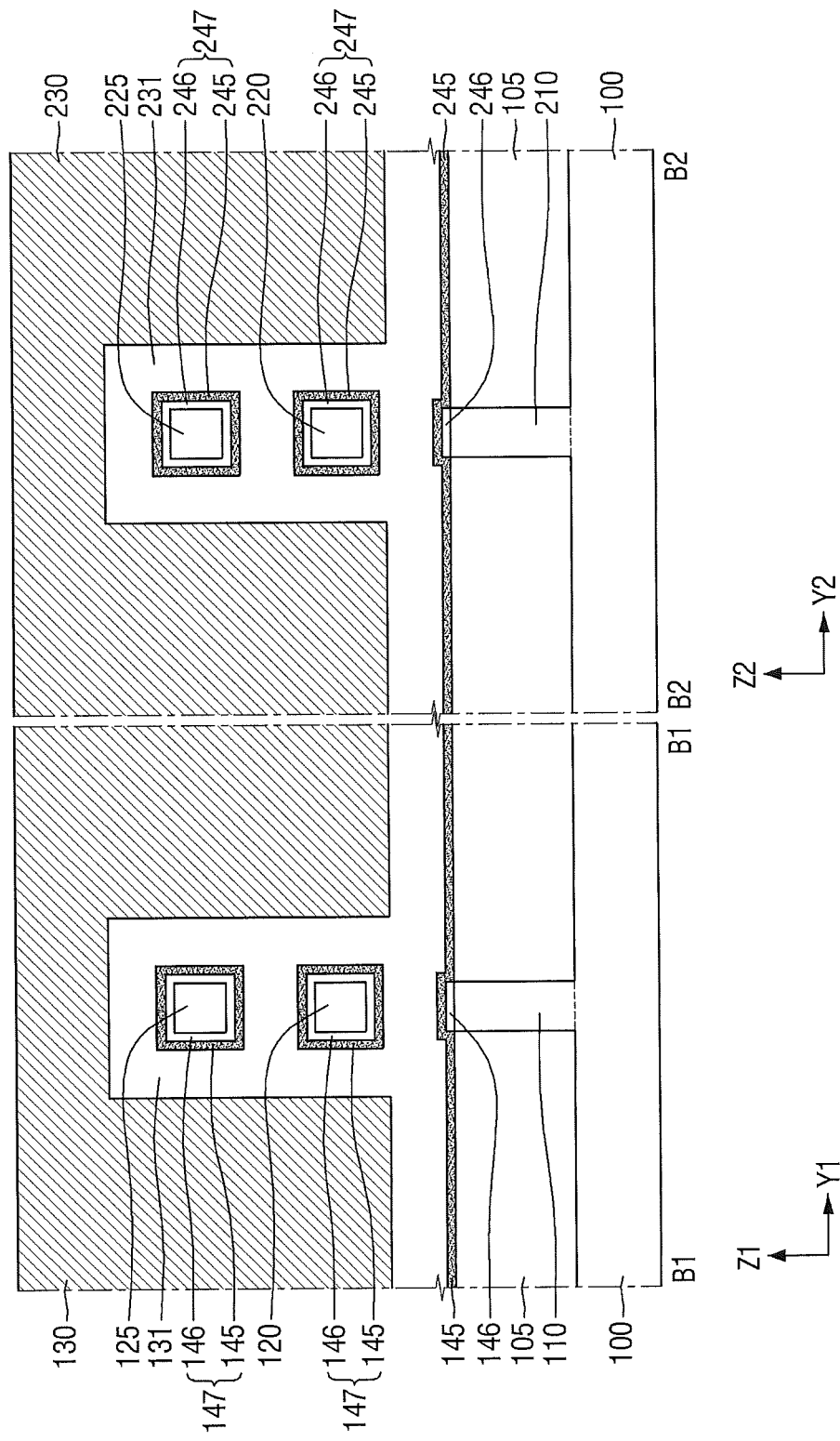

FIGS. 12 to 13 are cross-sectional views illustrating a semiconductor device according to some embodiments of the inventive concepts. Semiconductor devices according to FIGS. 12 to 13 may be similar to the semiconductor devices described above with respect to FIGS. 5 through 7 except for the differences described below. Reference numerals the same as or similar to those described with respect to the foregoing figures may represent the same or similar elements, and descriptions thereof may be omitted or briefly described in the following description in order to simplify the description.

Referring to FIGS. 12 and 13, unlike the semiconductor device illustrated in FIGS. 5 to 7, in the first region I, the first metal layer 131 may partially fill the region where the first gate electrode 130 illustrated in FIG. 5 will be formed. In the second region II, the second metal layer 231 may partially fill the region where the second gate electrode 230 illustrated in FIG. 5 will be formed.

Unlike the semiconductor device illustrated in FIGS. 10 and 11, the first metal layer 131 and the second metal layer 231 may not form a fill metal. According to some embodiments, the first gate electrode 130 and the second gate electrode 230 may be partly formed on the third nanowire 125 and the fourth nanowire 225, respectively.

Hereinafter, a semiconductor device according to some embodiments of the inventive concepts will be explained with reference to FIG. 14.

Figure 14:
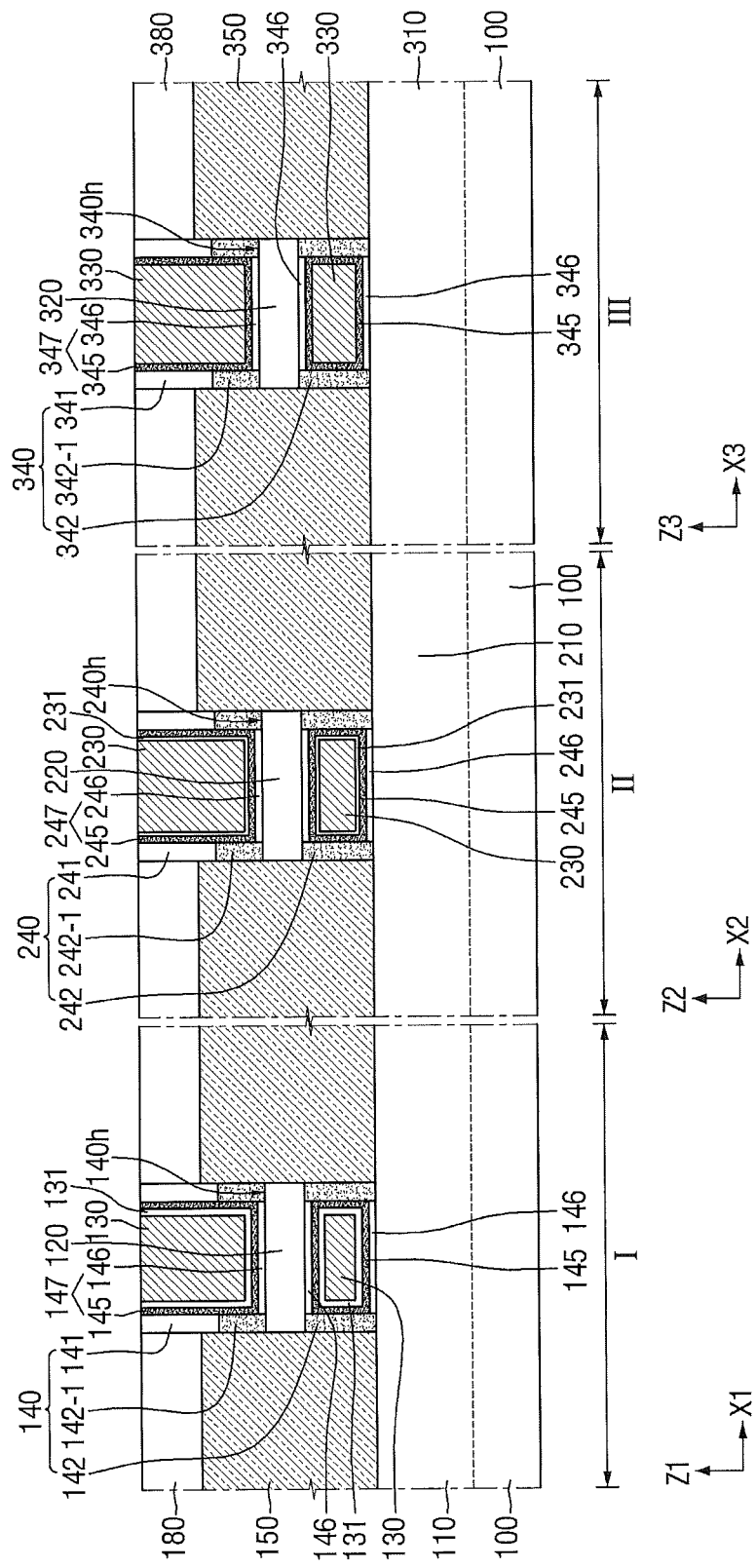
FIG. 14 is a cross-sectional view illustrating a semiconductor device according to some embodiments of the inventive concepts.

FIG. 14 is a cross-sectional view illustrating a semiconductor device according to some embodiments of the inventive concepts. Semiconductor devices according to FIG. 14 may be similar to the semiconductor devices described above with respect to FIGS. 1 through 4 except for the differences described below. Reference numerals the same as or similar to those described with respect to FIG. 14 may represent the same or similar elements, and descriptions thereof may be omitted or briefly described in the following description in order to simplify the description.

Referring to FIG. 14, a substrate 100 may include a first region I, a second region II and a third region III. The first to third regions I, II and III may be adjacent to one another, or may be spaced apart from one another.

The third region III may be defined by a seventh direction X3, an eighth direction Y3 and a ninth direction Z3 that are perpendicular one another.

The first region I and the second region II illustrated in FIG. 14 may be the same as the first region I and the second region II illustrated in FIG. 2, respectively. Also, a device that is similar to the device formed on the first region I may be formed on the third region III. Specifically, the third region III may include a third fin-type pattern 310, a fifth nanowire 320, a third gate electrode 330, a third gate spacer 340 and a third source/drain 350. The third fin-type pattern 310, the fifth nanowire 320, the third gate electrode 330, the third gate spacer 340 and the third source/drain 350 may respectively have the same characteristics as the first fin-type pattern 110, the first nanowire 120, the first gate electrode 130, the first gate spacer 140 and the first source/drain 150 which are described above.

Further, a third interlayer insulating layer 380, a third through-hole 340h, a third interfacial layer 346, a third high-k insulating layer 345, a seventh inner spacer 342, an eighth inner spacer 342-1 and a third outer spacer 341 may respectively have the same characteristics as the first interlayer insulating layer 180, the first through-hole 140h, the first interfacial layer 146, the first high-k insulating layer 145, the first inner spacer 142, the second inner spacer 142-1 and the first outer spacer 141. However, in the third region III, the third high-k insulating layer 345 may be directly contact with the third gate electrode 330. That is, unlike the first region I and the second region II, the metal layer may not be formed on the third region III.

In some embodiments, in the third region III, a third metal layer may be formed on a top surface of the third high-k insulating layer 345. The third metal layer may surround a periphery of the fifth nanowire 320. The third metal layer may be formed between the third gate electrode 330 and the third high-k insulating layer 345. The third metal layer may include third crystal grains therein. The third metal layer may have a third crystal grain size. The third crystal grain size may refer to an average size of the third crystal grains. The third crystal grain size may be different from the first crystal grain size and different from the second crystal grain size.

Hereinafter, methods of fabricating semiconductor devices according to some embodiments of the inventive concepts will be explained with reference to FIGS. 1 to 4 and 15 to 36.

Figure 22:
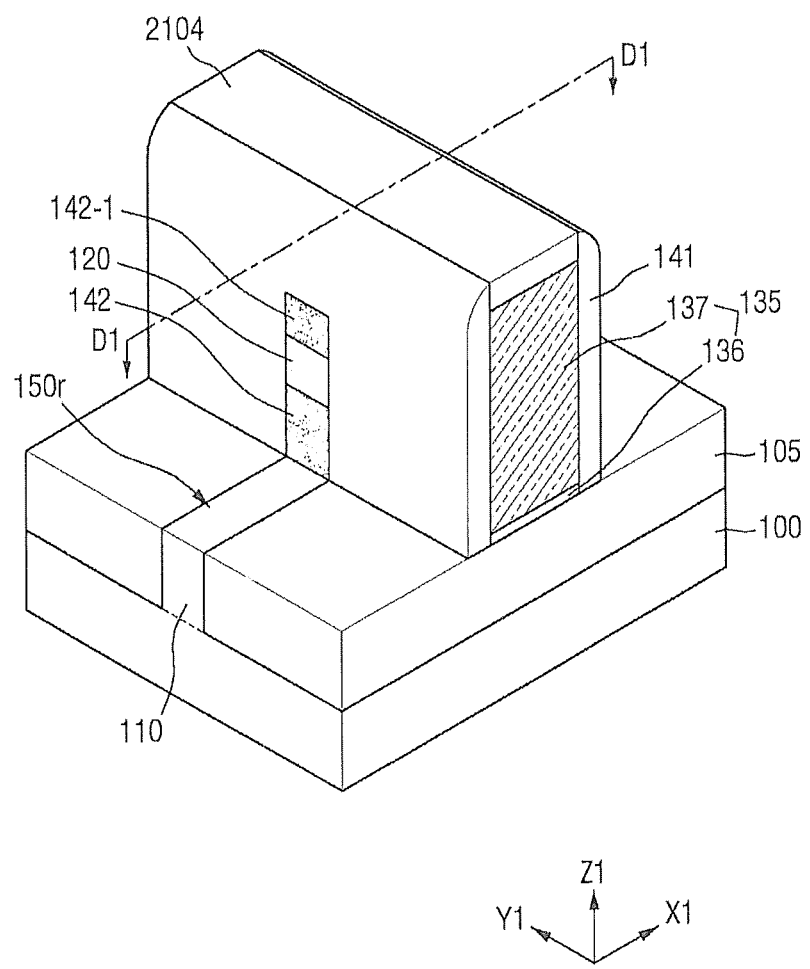
Figure 23:
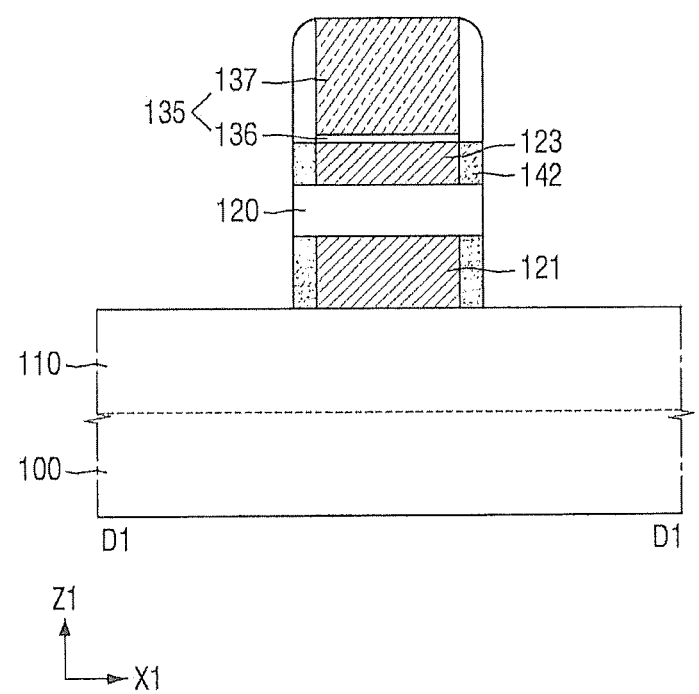
Figure 26:
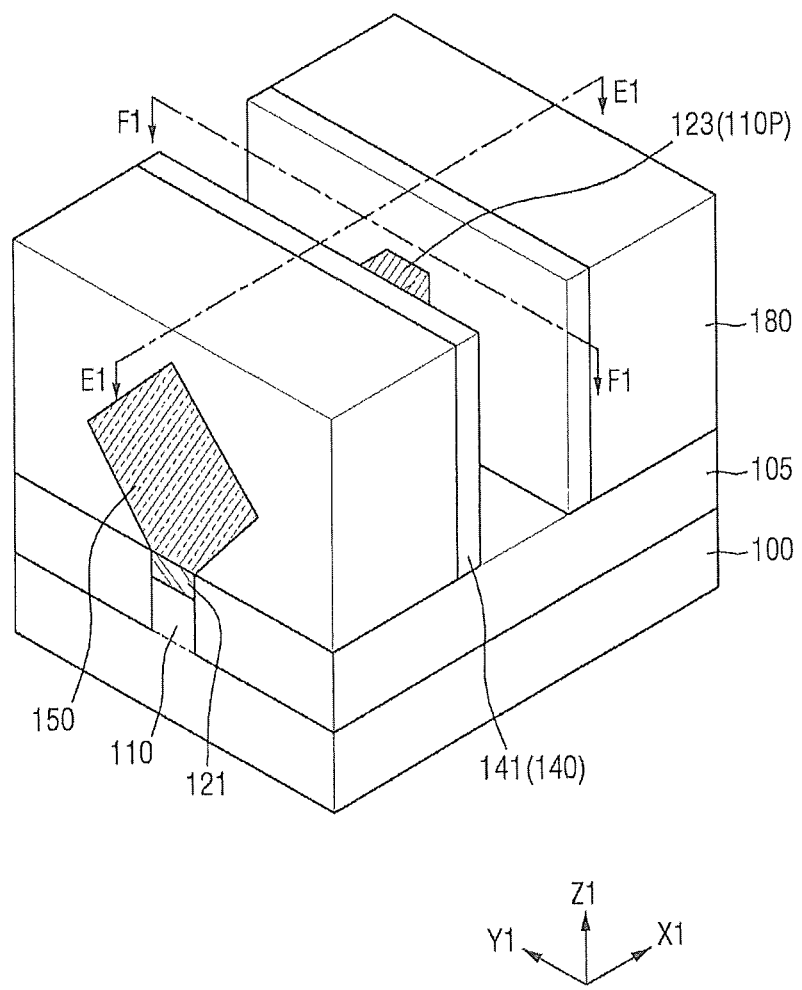
Figure 27:
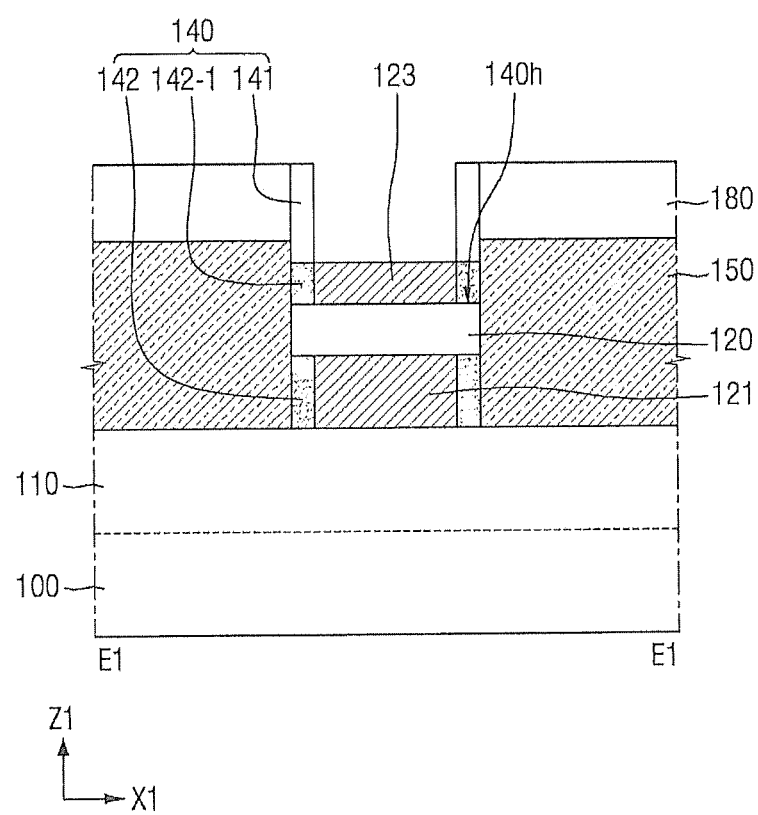
Figure 28:
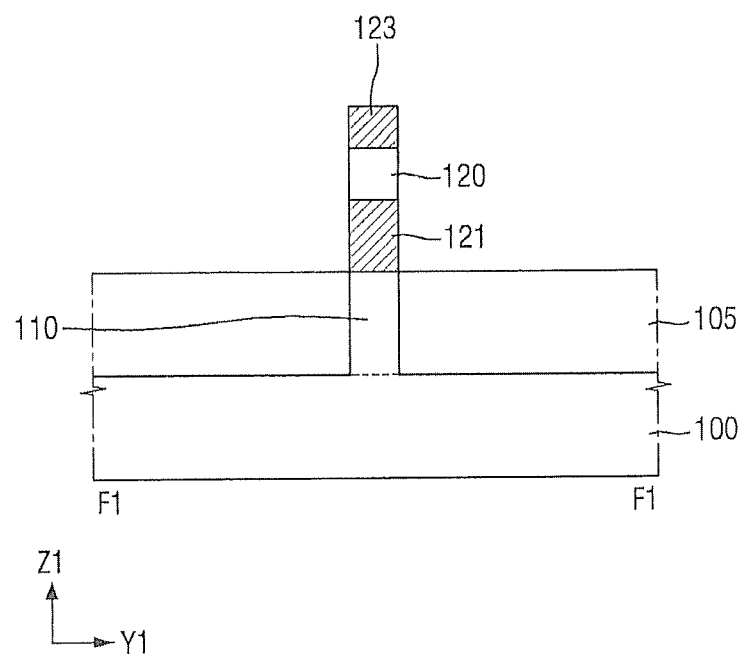
Figure 29:
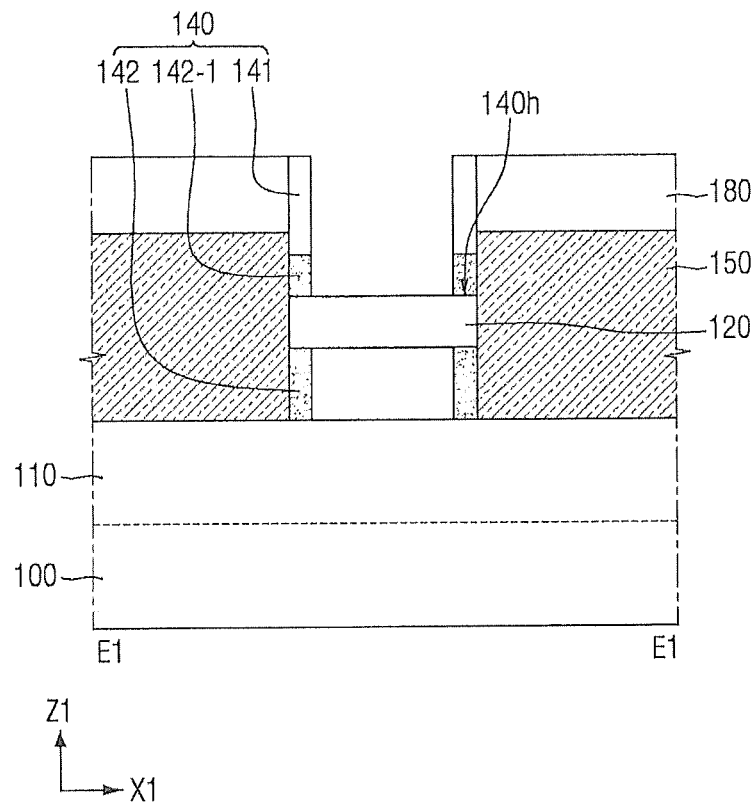
Figure 30:
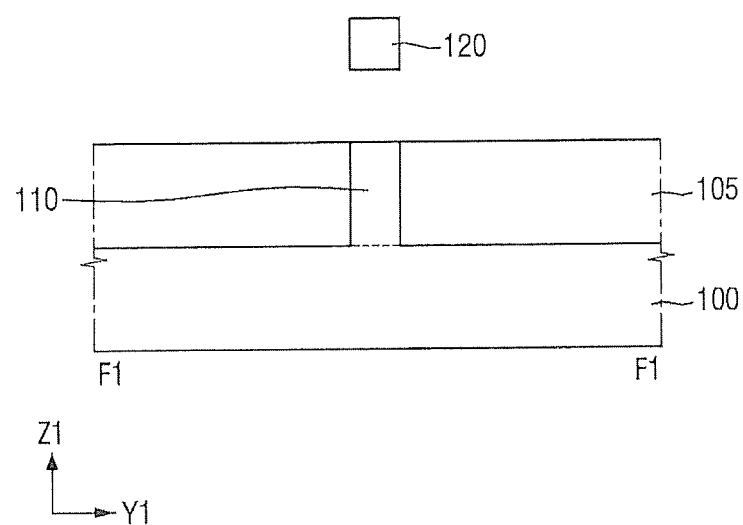

FIGS. 15 to 36 are views illustrating intermediate stages in methods of fabricating semiconductor devices according to some embodiments of the inventive concepts. For reference, FIG. 23 is a cross-sectional view taken along line D1-D1 of FIG. 22, FIGS. 27 and 29 are cross-sectional views taken along line E1-E1 of FIG. 26, and FIGS. 28 and 30 are cross-sectional views taken along line F1-F1 of FIG. 26.

A first region I and a second region II may be identically formed on a substrate 100 as shown in FIGS. 15 to 30. Thus, in FIGS. 15 to 30, methods of fabricating semiconductor devices will be explained based on the first region I, and thereafter, in FIGS. 31 to 36, the first region I and the second region II will be explained together.

Figure 15:
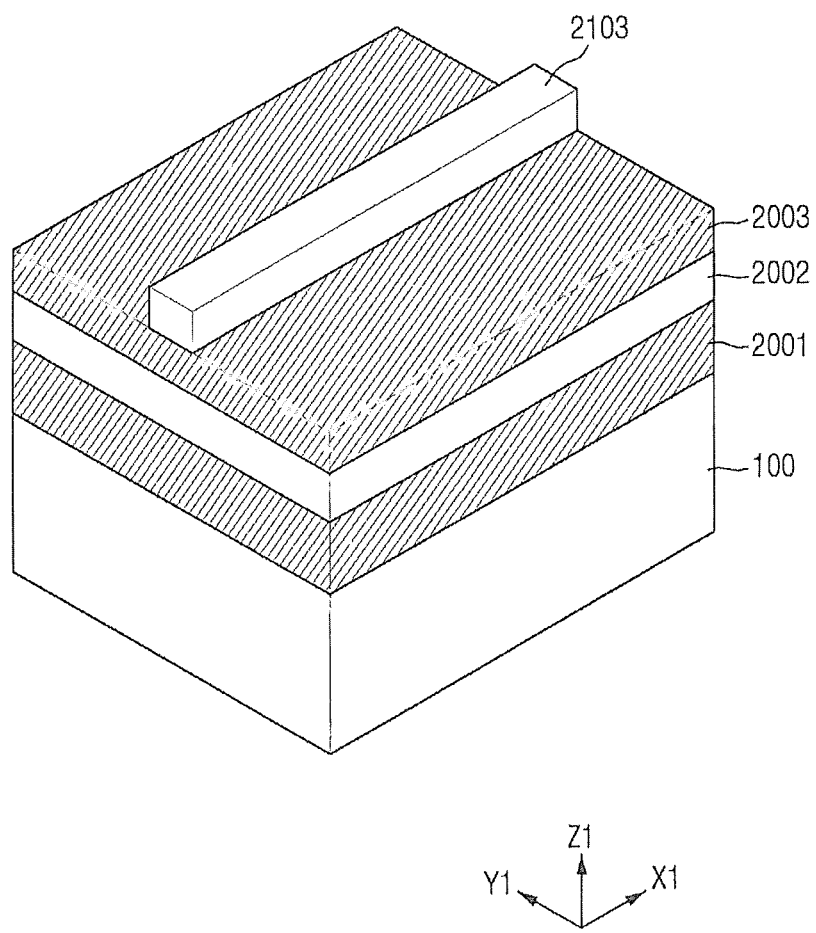
FIGS. 15 to 36 are views illustrating intermediate stages in methods of fabricating semiconductor devices according to some embodiments of the inventive concepts.

Referring to FIG. 15, a first sacrificial layer 2001, an active layer 2002 and a second sacrificial layer 2003 may be sequentially formed on the substrate 100.

The first sacrificial layer 2001 and the second sacrificial layer 2003 may include the same material, and the first sacrificial layer 2001 and the active layer 2002 may include different materials. In explaining methods of fabricating semiconductor devices according to some embodiments, it is assumed that the first sacrificial layer 2001 and the second sacrificial layer 2003 include the same material. Further, the active layer 2002 may include a material having an etch selectivity with respect to the first sacrificial layer 2001.

For example, the substrate 100 and the active layer 2002 may include a material to be used as a channel region for a transistor. That is, in the case of PMOS, the active layer 2002 may include a material with high hole mobility, and in the case of NMOS, the active layer 2002 may include a material with high electron mobility.

The first sacrificial layer 2001 and the second sacrificial layer 2003 may include a material having a similar lattice constant and lattice structure as the active layer 2002. That is, the first sacrificial layer 2001 and the second sacrificial layer 2003 may include a semiconductor material or a crystallized metal material.

In explaining methods of fabricating semiconductor devices according to some embodiments, it is assumed that the active layer 2002 includes silicon, and the first sacrificial layer 2001 and the second sacrificial layer 2003 each include silicon germanium.

FIG. 15 illustrates only one the active layer 2002, but this is only for illustrative purpose and embodiments are not limited thereto. That is, a plurality of pairs of the first sacrificial layer 2001 and the active layer 2002 may be alternately formed, and then, the second sacrificial layer 2003 may be formed on the uppermost active layer 2002.

Further, although FIG. 15 illustrates the second sacrificial layer 2003 being positioned on the uppermost portion of the stack layer structure, embodiments are not limited thereto. That is, it is of course possible that the active layer 2002 is positioned on the uppermost portion of the stack layer structure.

Next, a first mask pattern 2103 may be formed on the second sacrificial layer 2003. The first mask pattern 2103 may be extended in a first direction X.

For example, the first mask pattern 2103 may include silicon oxide, silicon nitride, and/or silicon oxynitride.

Figure 16:
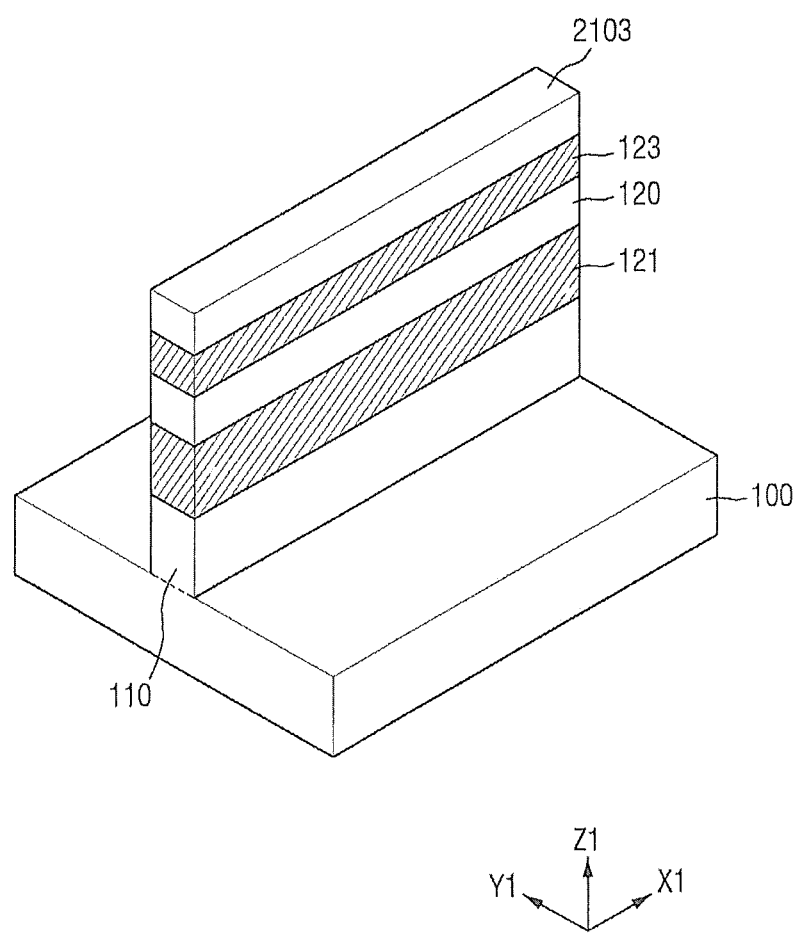
Figure 17:
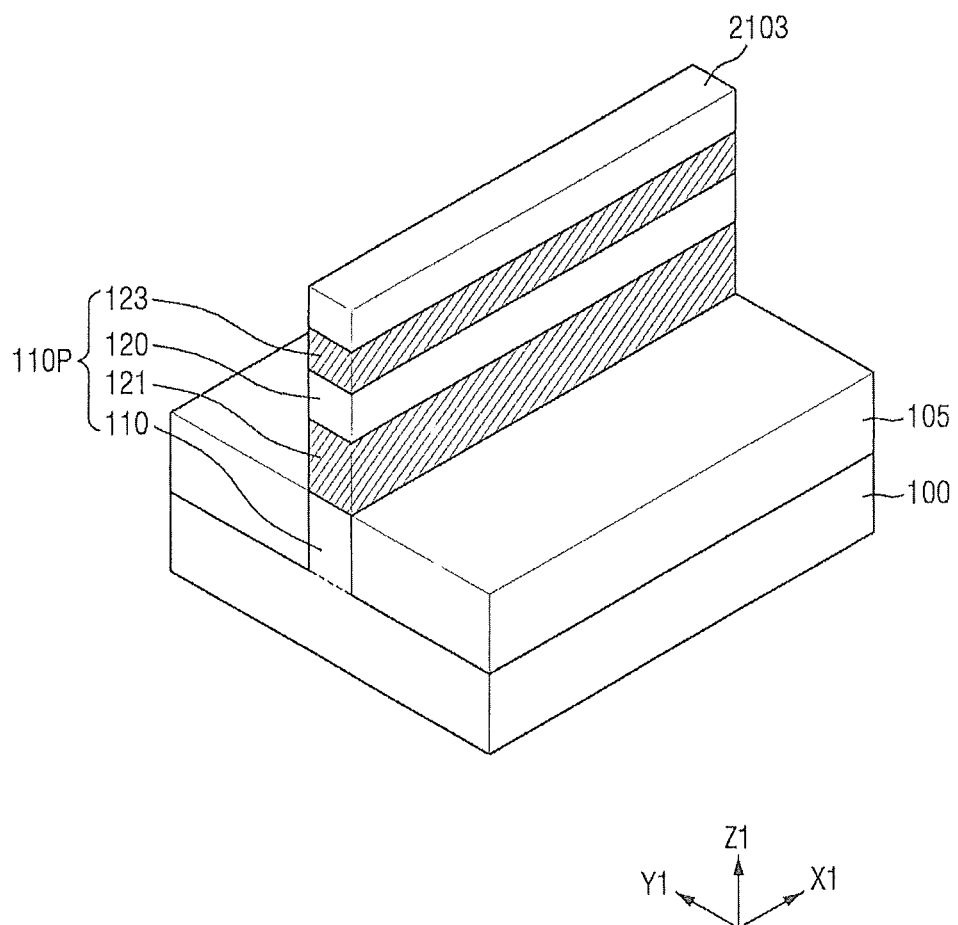

Referring to FIG. 16, an etch process may be performed using the first mask pattern 2103 as a etch mask in order to form a fin-type structure (110P in FIG. 17).

The second sacrificial layer 2003, the active layer 2002, the first sacrificial layer 2001 and the substrate 100 may be patterned to form the fin-type structure (110P in FIG. 17).

The fin-type structure (110P in FIG. 17) may be formed on the substrate 100, and protruded from the substrate 100. Like the first mask pattern 2103, the fin-type structure (110P in FIG. 17) may be extended in the first direction X.

In the fin-type structure (110P in FIG. 17), a first fin-type pattern 110, a first sacrificial pattern 121, a first nanowire 120 and a second sacrificial pattern 123 may be sequentially stacked on the substrate 100.

Referring to FIG. 17, a field insulating layer 105 may be formed on the substrate 100 to partially cover sidewalls of the fin-type structure 110P.

Specifically, the field insulating layer 105 covering the fin-type structure 110P may be formed on the substrate 100. Then, by performing a planarization process of the field insulating layer 105, a top surface of the fin-type structure 110P and a top surface of the field insulating layer 105 may be in the same plane.

The first mask pattern 2103 may be removed in the planarization process, but not limited thereto.

The field insulating layer 105 may be then recessed to expose a portion of the fin-type structure 110P. The recessing process may include a selective etching process. That is, the fin-type structure 110P may be protruded above the field insulating layer 105.

As illustrated in FIG. 17, the first sacrificial pattern 121, the first nanowire 120, and the second sacrificial pattern 123 may be protruded above the top surface of the field insulating layer 105, and the sidewalls of the first fin-type pattern 110 may be entirely surrounded by the field insulating layer 105, but embodiments are not limited thereto. That is, a portion of the sidewall of the first fin-type pattern 110 may be protruded above the field insulating layer 105 by recessing an upper portion of the field insulating layer 105.

Before and/or after the recessing process that causes a portion of the fin-type structure 110P to protrude above the top surface of the field insulating layer 105, a doping process for the purpose of threshold voltage adjustment may be performed on the first nanowire 120. When the semiconductor device is an NMOS transistor, an impurity may be boron (B). When the semiconductor device is a PMOS transistor, the impurity may be phosphorus (P), or arsenic (As), but not limited thereto.

Figure 18:
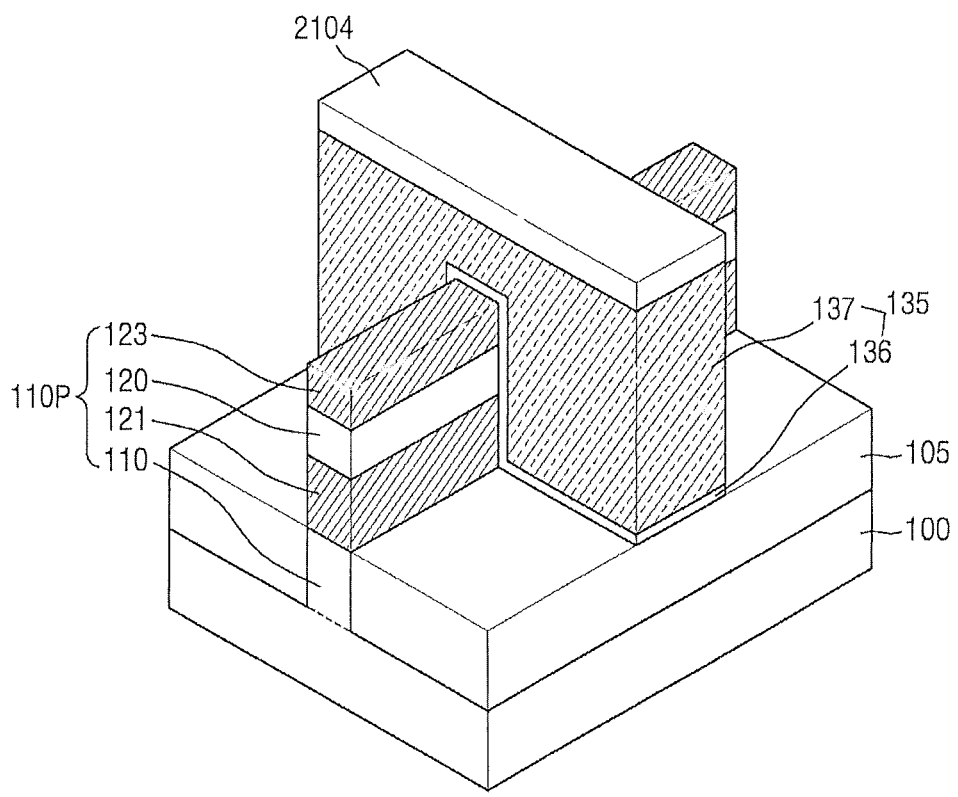

Referring to FIG. 18, a dummy gate pattern 135 intersecting with the fin-type structure 110P and extending in the second direction Y may be formed by performing an etch process using a second mask pattern 2104 as an etch mask. The dummy gate pattern 135 may be formed on the fin-type structure 110P.

The dummy gate pattern 135 may include a dummy gate insulating layer 136 and a dummy gate electrode 137. For example, the dummy gate insulating layer 136 may include a silicon oxide layer, and the dummy gate electrode 137 may include polycrystalline silicon or amorphous silicon.

Figure 19:
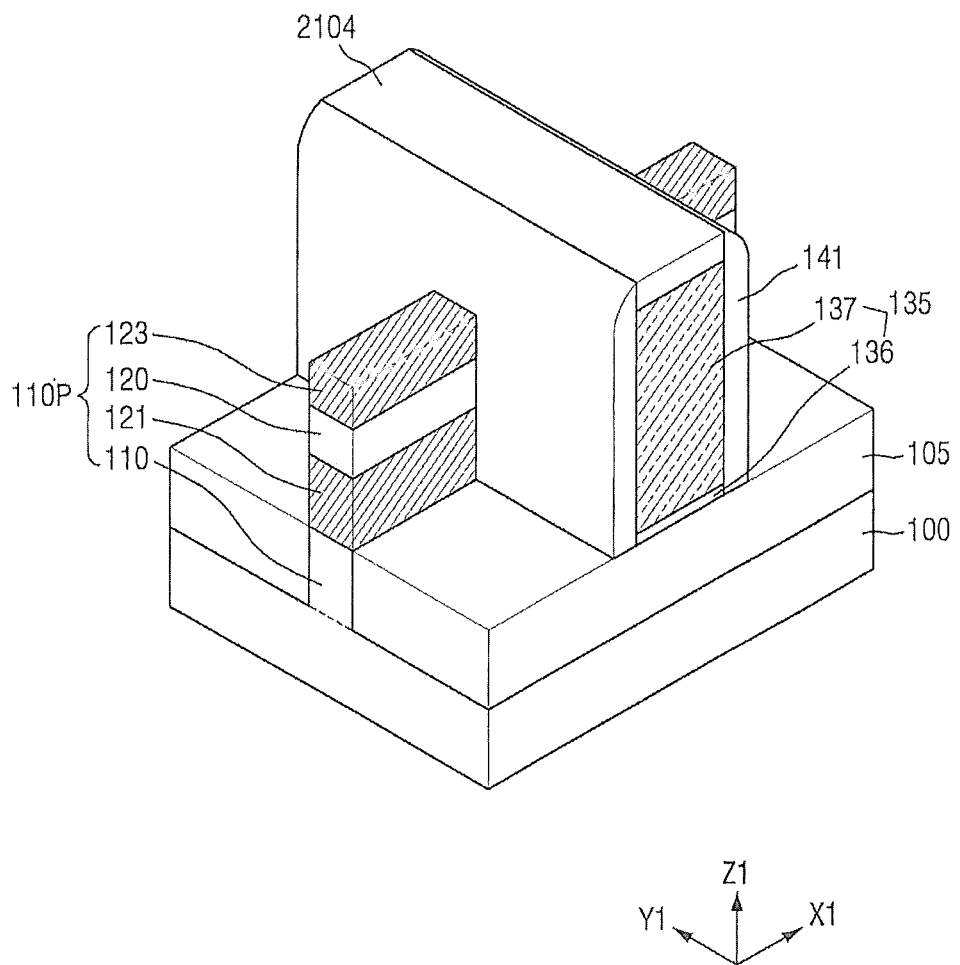

Referring to FIG. 19, a first outer spacer 141 may be formed on a sidewall of the dummy gate pattern 135. That is, the first outer spacer 141 may be formed on sidewalls of the dummy gate insulating layer 136 and the dummy gate electrode 137.

Specifically, a first spacer layer may be formed on the field insulating layer 105 to cover the dummy gate pattern 135 and the fin-type structure 110P. The first spacer layer may then be etched back, thereby forming the first outer spacer 141 on the sidewall of the dummy gate pattern 135.

Figure 20:
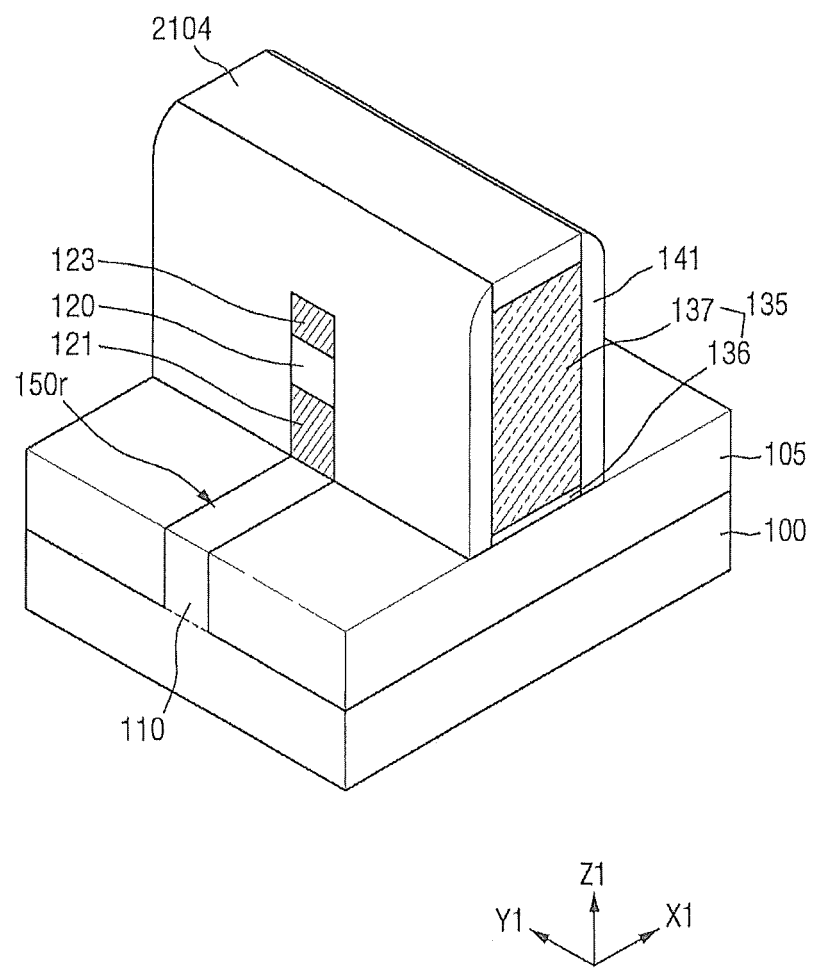

Referring to FIG. 20, a portion of the fin-type structure 110P non-overlapped with the dummy gate electrode 137 and the first outer spacer 141 may be removed using the dummy gate pattern 135 and the first outer spacer 141 as an etch mask. Thus, a recess 150r may be formed within the fin-type structure 110P. A bottom surface of the recess 150r may be a top surface of the first fin-type pattern 110.

Forming the first outer spacer 141 and forming the recess 150r may be concurrently performed, but embodiments are not limited thereto. That is, after the first outer spacer 141 is formed, the recess 150r may be formed by removing the portion of the fin-type structure 110P.

During the formation of the recess 150r in the fin-type structure 110P, a portion of the first sacrificial pattern 121 and the second sacrificial pattern 123 which are non-overlapped with the dummy gate electrode 137 and the first outer spacer 141 may be removed. Further, during the formation of the recess 150r in the fin-type structure 110P, the first nanowire 120 may be formed by removing a portion of the first nanowire 120 non-overlapped with the dummy gate electrode 137 and the first outer spacer 141.

A cross section of the first sacrificial pattern 121, a cross section of the second sacrificial pattern 123 and a cross section of the first nanowire 120 may be exposed by the recess 150r.

Figure 21:
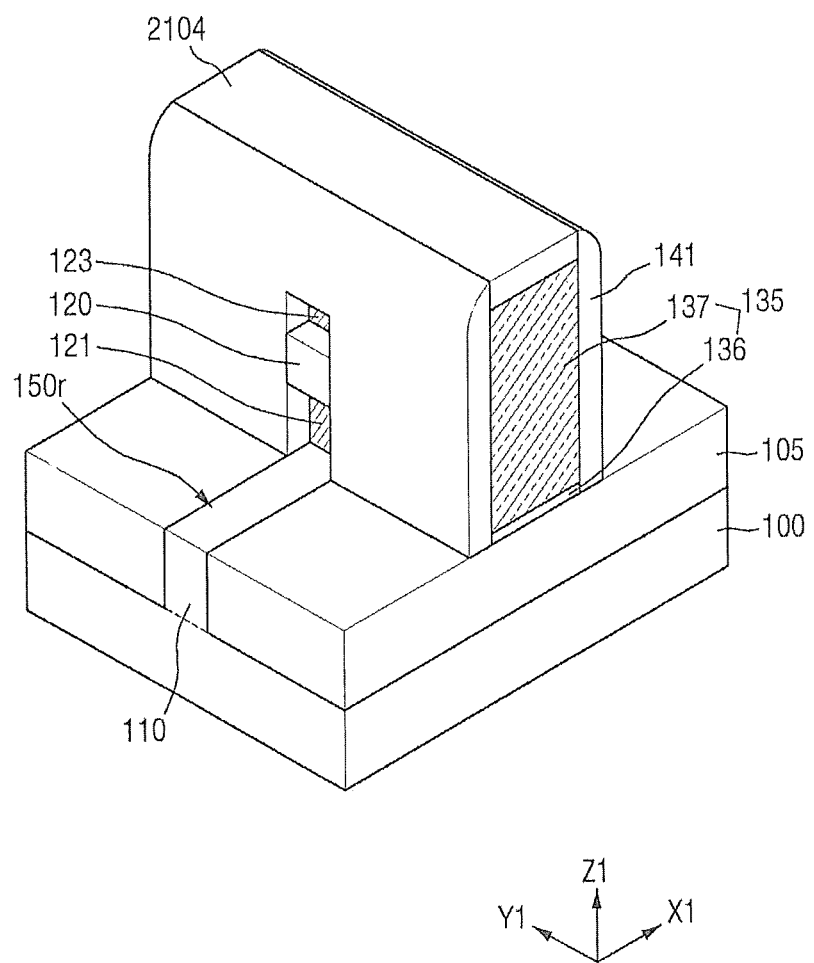

Referring to FIG. 21, at least a portion of the first sacrificial pattern 121 and at least a portion of the second sacrificial pattern 123, which are exposed by the recess 150r and overlapped with the first outer spacer 141, may be removed. In some embodiments, a dimple may be formed in the first outer spacer 141. The dimple may also be formed between the first outer spacer 141 and the first nanowire 120, that is, in a portion of the second sacrificial pattern 123 overlapped with the first outer spacer 141.

The dimple may be in a shape that is depressed in the first direction X1 further than the cross section of the first nanowire 120 exposed by the recess 150r.

For example, the dimple may be formed using a selective etching process. Specifically, the dimple may be formed by the selective etching process that uses an etchant with a higher etch rate for the first sacrificial pattern 121 and the second sacrificial pattern 123 than an etch rate for the first nanowire 120.

Referring to FIGS. 22 and 23, the dimple may be filled with an insulating material to form a first inner spacer 142 and a second inner spacer 142-1.

Specifically, a second spacer layer for filling the dimple may be formed. The second spacer layer may be a material with a good gap-filling ability. The second spacer layer may also be formed on the field insulating layer 105, sidewalls of the first outer spacer 141 and the dummy gate pattern 135.

An etching process may then be performed by etching the second spacer layer until the first fin-type pattern 110 non-overlapped with the dummy gate pattern 135 and the first outer spacer 141 is exposed. Thus, the first inner spacer 142 and the second inner spacer 142-1 may be formed. As a result, a first gate spacer 140 may be formed.

Further, a through-hole, which is defined by the first outer spacer 141, the first inner spacer 142 and the second inner spacer 142-1, may be formed in the first gate spacer 140. The first nanowire 120 may be exposed through the through-hole. That is, the first nanowire 120 may penetrate the through-hole.

Figure 24:
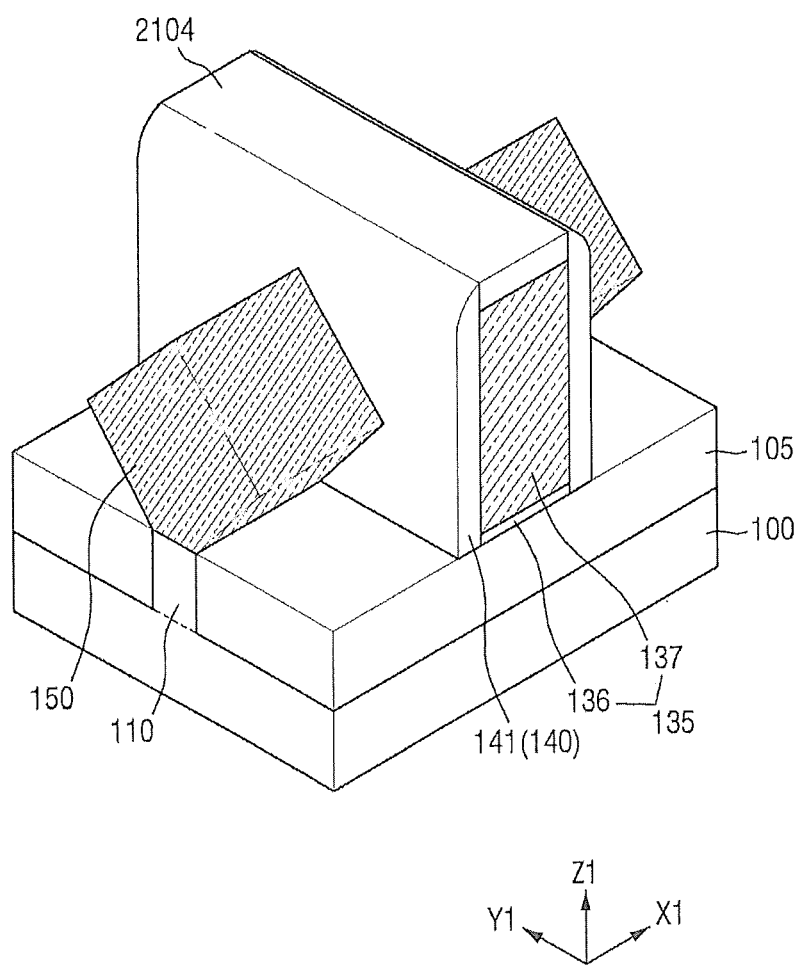

Referring to FIG. 24, a first source/drain 150 for filling the recess 150r may be formed. The first source/drain 150 may be formed on opposite sides of the dummy gate pattern 135.

The first source/drain 150 may be formed using the exposed first nanowire 120 as a seed layer, but embodiments are not limited thereto. It is of course possible that a seed layer may be additionally formed on the protruding cross section of the first nanowire 120 and the first fin-type pattern 110 that are exposed by the recess 150r.

The first source/drain 150 may be formed to cover the first inner spacer 142. The first source/drain 150 may be connected with the first inner spacer 142.

The first source/drain 150 may be formed by an epitaxial process. Depending on whether a semiconductor device according to embodiments of the inventive concepts is an n-type transistor or a p-type transistor, a material for an epitaxial layer included in the first source/drain 150 may vary. Further, depending on needs, impurity may be doped in situ during the epitaxial process.

Figure 25:
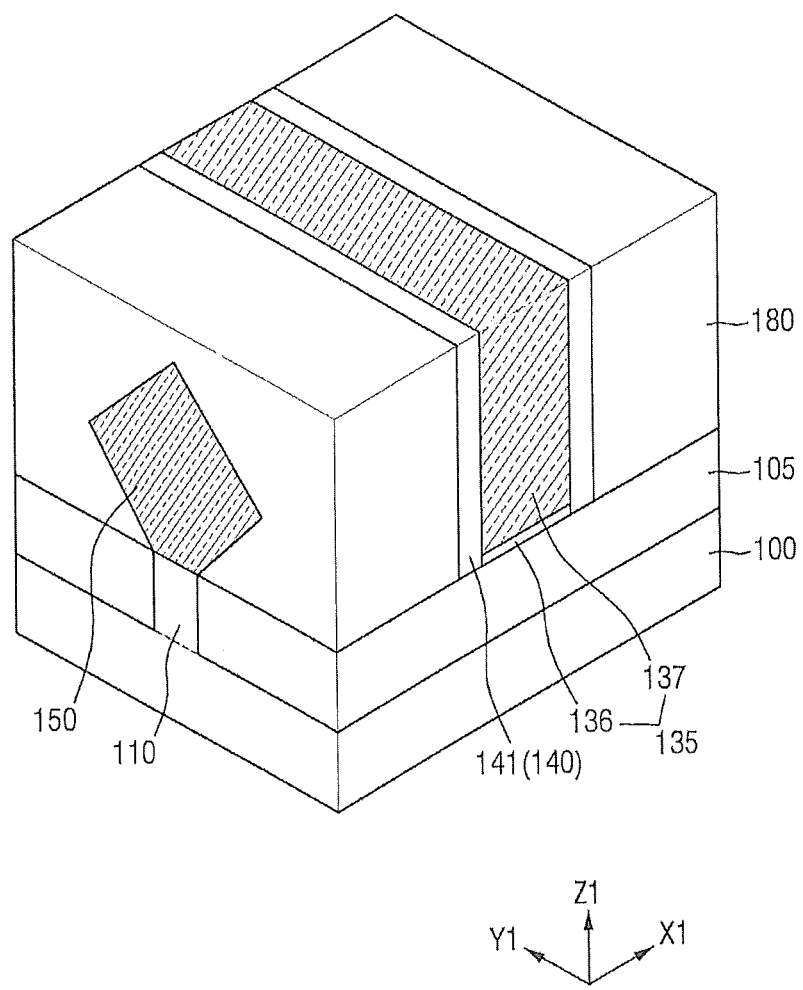

Referring to FIG. 25, a first interlayer insulating layer 180 covering the first source/drain 150, the first gate spacer 140, the dummy gate pattern 135, and so on may be formed on the field insulating layer 105.

The first interlayer insulating layer 180 may include a low-k dielectric material, an oxide layer, a nitride layer and/or an oxynitride layer. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD) oxide, and/or a combination thereof.

The first interlayer insulating layer 180 may be then planarized until a top surface of the dummy gate electrode 137 is exposed. As a result, the second mask pattern 2104 may be removed, thereby exposing the top surface of the dummy gate electrode 137.

Referring to FIGS. 26 to 28, the dummy gate pattern 135, i.e., the dummy gate insulating layer 136 and the dummy gate electrode 137 may be removed.

With the removal of the dummy gate insulating layer 136 and the dummy gate electrode 137, the field insulating layer 105 and the fin-type structure 110P, which are overlapped with the dummy gate pattern 135, may be exposed. That is, the first sacrificial pattern 121, the second sacrificial pattern 123 and the first nanowire 120, which are overlapped with the dummy gate pattern 135, may be exposed.

Referring to FIGS. 29 and 30, the first sacrificial pattern 121 and the second sacrificial pattern 123 may be removed from the fin-type structure 110P.

As a result, the first nanowire 120 may be exposed on the first fin-type pattern 110.

Removing the first sacrificial pattern 121 and the second sacrificial pattern 123 over and under the first nanowire 120 may involve use of an etch process, for example. That is, an etch selectivity among the first sacrificial pattern 121, the second sacrificial pattern 123 and the first nanowire 120 may be used.

As explained above, the devices illustrated in FIGS. 15 to 30 may be concurrently formed on the first region I and the second region II of the substrate 100. Hereinafter, the first region I and the second region II will be concurrently explained with reference to FIGS. 31 to 36.

Figure 31:
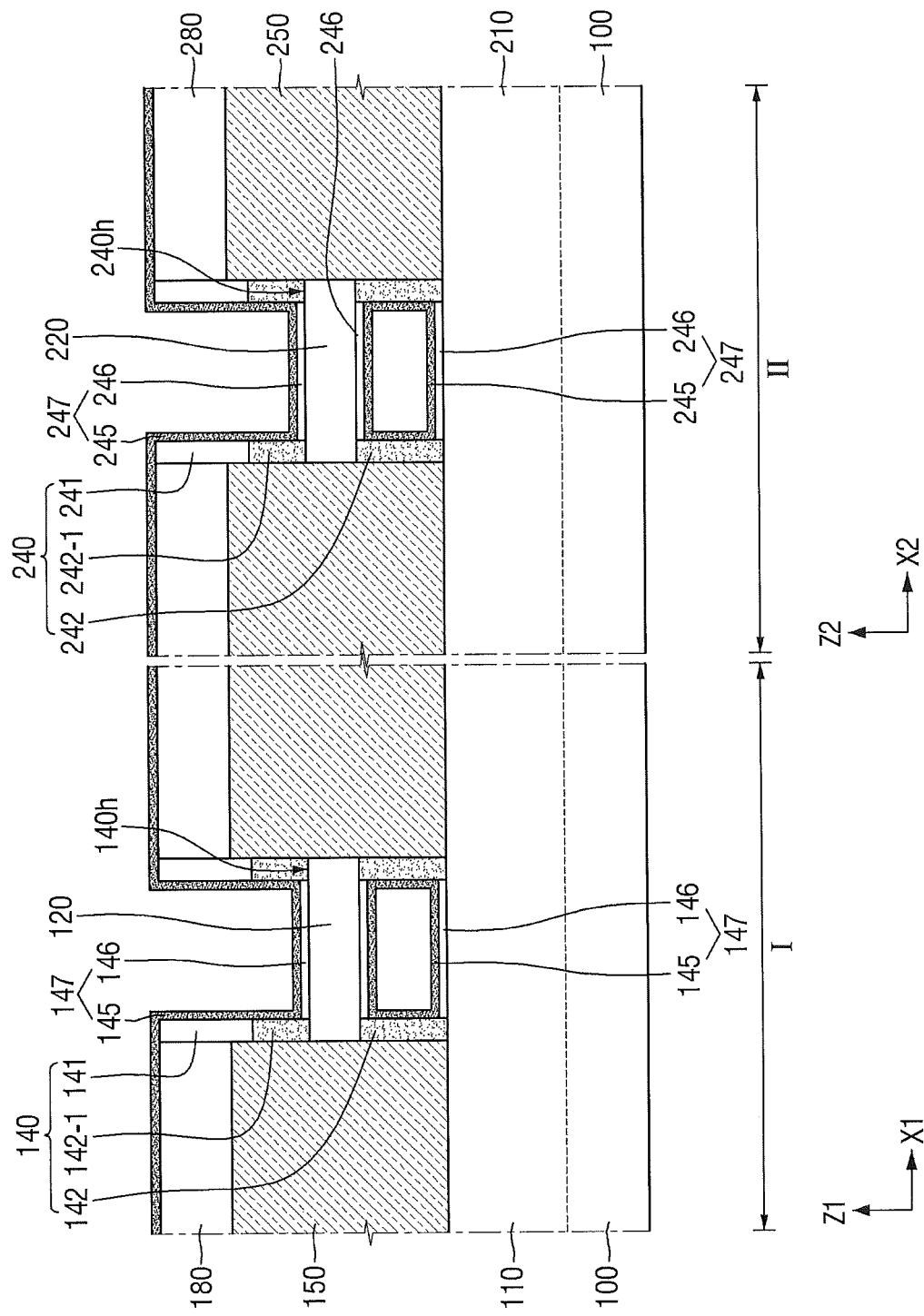
Figure 32:
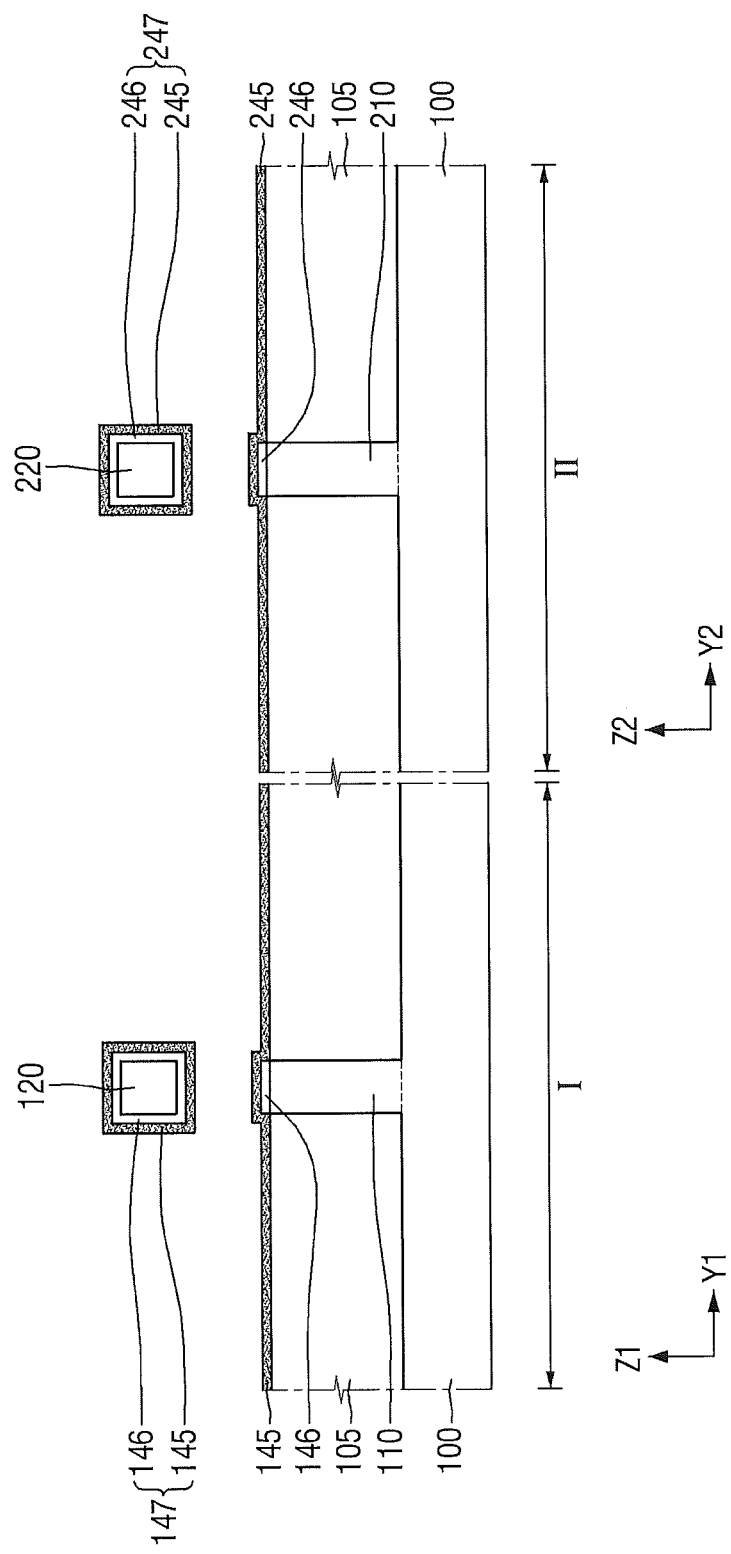

Referring to FIGS. 31 and 32, a first gate insulating layer 147 may be conformally formed on the first region I, and a second gate insulating layer 247 may be conformally formed on the second region II.

The first gate insulating layer 147 may include a first high-k insulating layer 145 and a first interfacial layer 146. The first interfacial layer 146 may be formed on the periphery of the first nanowire 120 and the top surface of the first fin-type pattern 110. The first high-k insulating layer 145 may be formed on the periphery of the first nanowire 120, the top surface of the first fin-type pattern 110 and the inner surface of the first gate spacer 140. Further, the first high-k insulating layer 145 may be extended to the top surface of the first interlayer insulating layer 180.

The second gate insulating layer 247 may include a second high-k insulating layer 245 and a second interfacial layer 246. The second interfacial layer 246 may be formed on the periphery of the second nanowire 220 and the top surface of the second fin-type pattern 210. The second high-k insulating layer 245 may be formed on the periphery of the second nanowire 220, the top surface of the second fin-type pattern 210 and the inner surface of the second gate spacer 240. Further, the second high-k insulating layer 245 may be extended to the top surface of the second interlayer insulating layer 280.

In some embodiments, after the first gate insulating layer 147 and the second gate insulating layer 247 are formed, the first barrier metal (132 in FIG. 8) and the second barrier metal (232 in FIG. 8) may be formed thereon. This may be a pre-step for the formation of the first metal layer (131 in FIG. 35) and the second metal layer (231 in FIG. 35).

Figure 33:
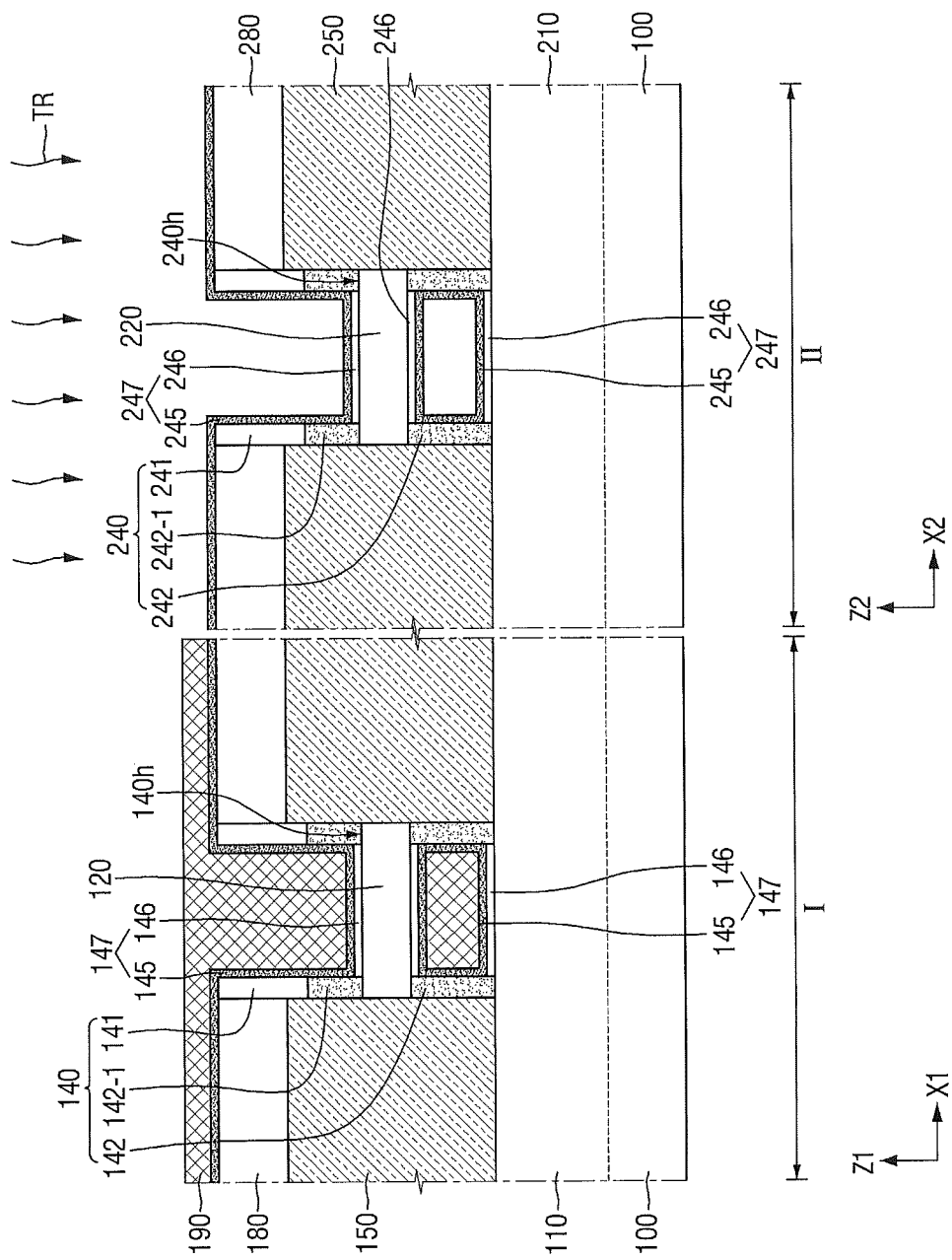
Figure 34:
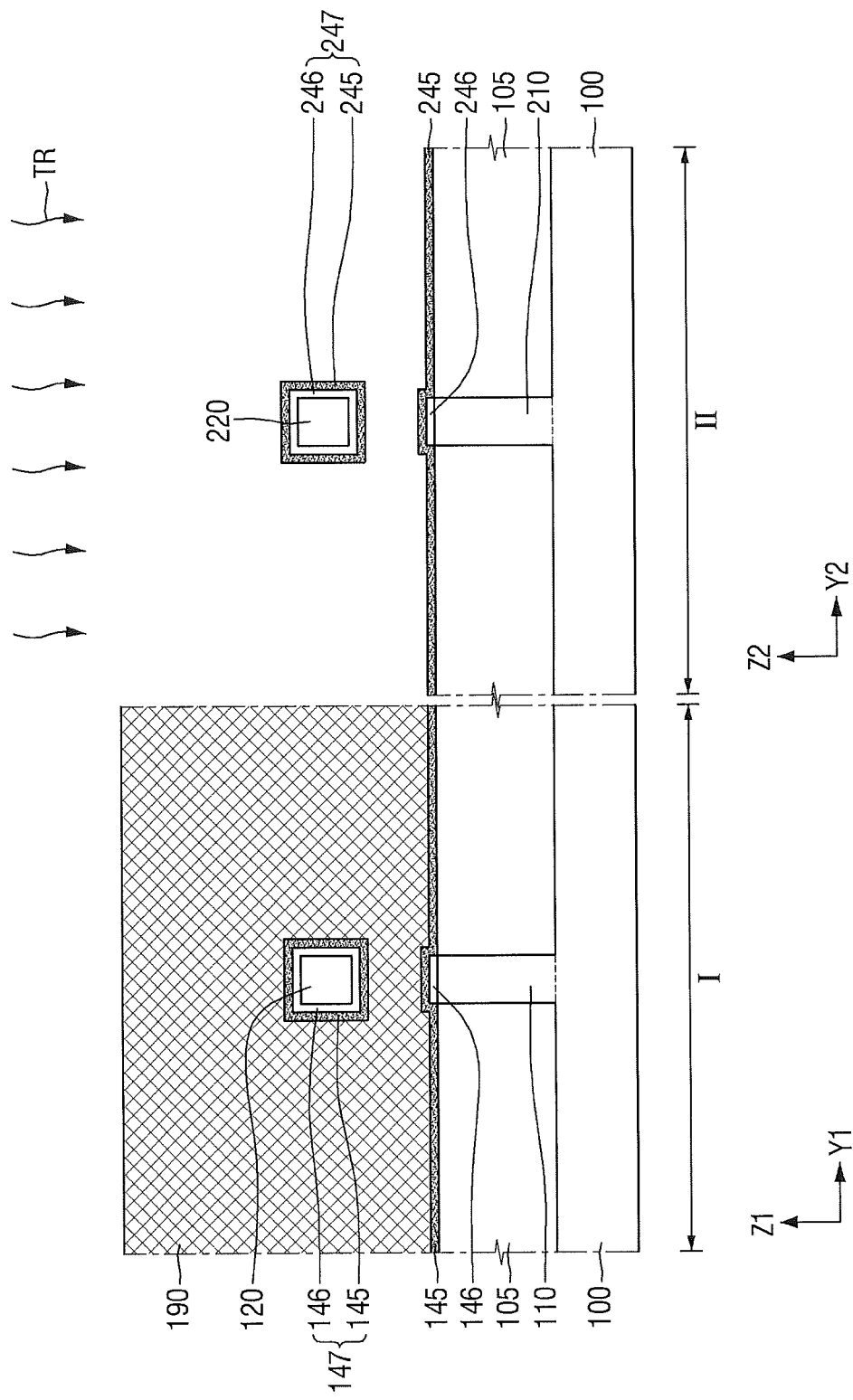

Referring to FIGS. 33 and 34, a blocking layer 190 may be formed on the first region I.

The blocking layer 190 may cover the first region I, and expose the second region II. The blocking layer 190 may be formed on the first high-k insulating layer 145, and may fill between the first gate spacer 140. The blocking layer 190 may include spin on hardmask SOH and/or photo resist PR.

Next, a surface treatment TR may be performed on the second region II.

The surface treatment TR may include $N_2$, $H_2$, Ar and/or $NH_3$ plasma treatment. A surface-bonding strength of the second region II may be decreased through the surface treatment TR so as to perform a selective growth by using difference of the surface-bonding strength in the first region I and the second region II. That is, it is possible to slow the growth of a metal layer on the second region II.

Figure 35:
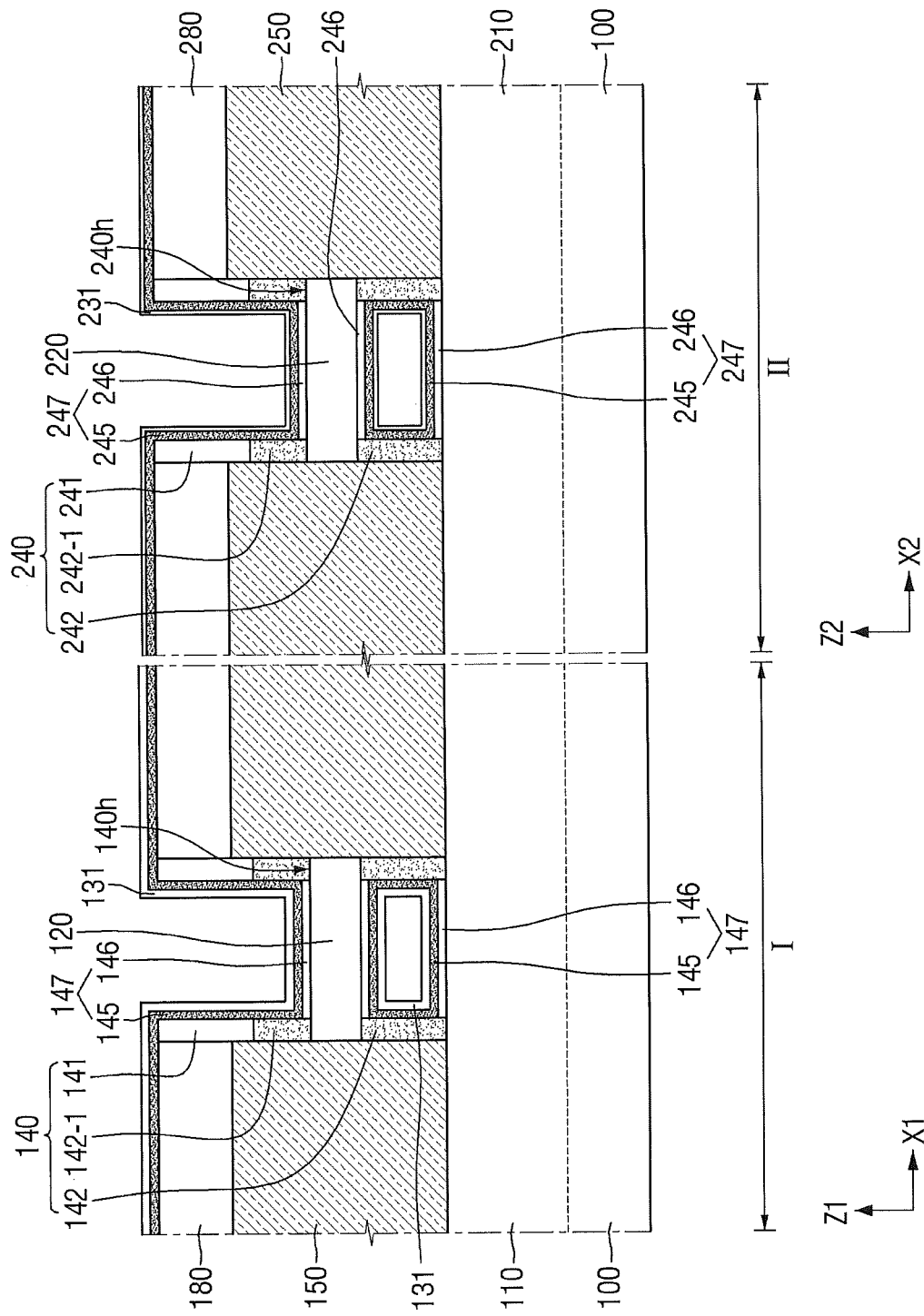
Figure 36:
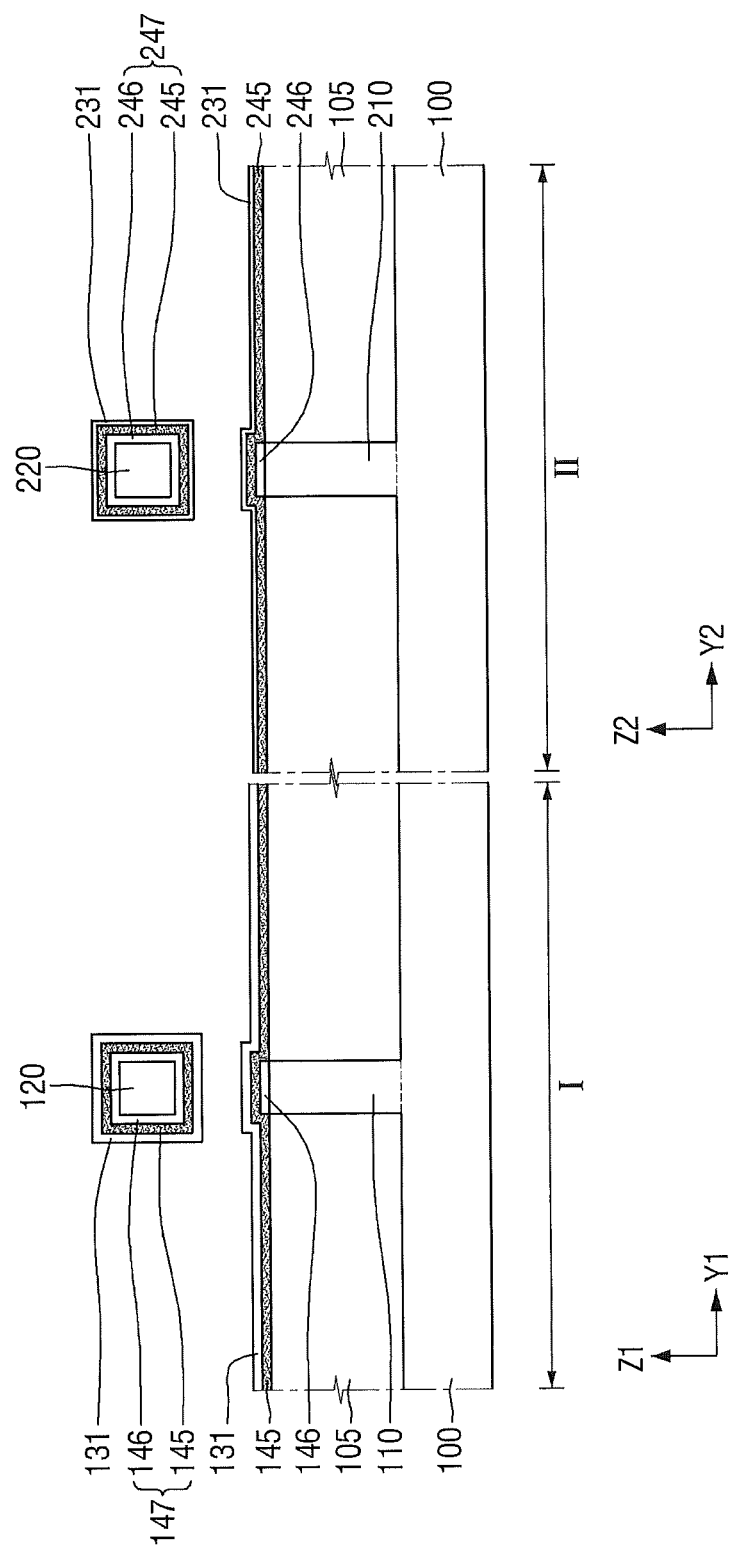

Referring to FIGS. 35 and 36, a first metal layer 131 may be formed on the first region I, and a second metal layer 231 may be formed on the second region II.

A crystal grain size of the first metal layer 131 may be greater than that of the second metal layer 231. The first metal layer 131 may apply tensile stress to the first nanowire 120, and the second metal layer 231 apply compressive stress to the second nanowire 220.

Next, referring back to FIGS. 1 to 4, the first gate electrode 130 and the second gate electrode 230 may be formed.

In a semiconductor device according to embodiments of the inventive concepts, a stress-inducing material within the first source/drain 150 can be formed in a contact area between the nanowire and the source/drain region.

That is, metal layers having different crystal grain sizes from each other may surround the channel regions, i.e., the nanowire. Thus, gate electrodes including the metal layers may apply different stresses from each other to the channel regions. As a result, carrier mobility in each of the channel regions can be enhanced.

While some embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
 a substrate;
 a nanowire spaced apart from the substrate and extending in a first direction;
 a gate insulating layer surrounding the nanowire;
 a gate electrode extending in a second direction intersecting the first direction and surrounding the nanowire, on the gate insulating layer;
 a source/drain on a sidewall of the gate electrode;
 a gate spacer between the gate electrode and the source/drain,
 wherein the gate spacer includes:
  a first inner spacer between the substrate and the nanowire;
  a second inner spacer on a top surface of the nanowire; and
  an outer spacer being in contact with a top surface of the second inner spacer,
 wherein the outer spacer has a first dielectric constant, and
 wherein the first inner spacer and the second inner spacer have a second dielectric constant different from the first dielectric constant.

2. The semiconductor device of claim 1, wherein the first dielectric constant is greater than the second dielectric constant.

3. The semiconductor device of claim 1,
 wherein the gate spacer includes a through-hole, and
 wherein the nanowire penetrates the gate spacer through the through-hole to be contact with the source/drain.

4. The semiconductor device of claim 3, wherein the through-hole is defined by a top surface of the first inner spacer and a bottom surface of the second inner spacer.

5. The semiconductor device of claim 1, wherein, in a plane intersecting the first direction, the outer spacer surrounds the nanowire, the first inner spacer and the second inner spacer.

6. The semiconductor device of claim 1, further comprising a metal layer surrounding the nanowire, between the gate insulating layer and the gate electrode,
 wherein the metal layer includes tungsten (W).

7. The semiconductor device of claim 6, wherein the metal layer is configured to apply one of a tensile stress and a compressive stress to the nanowire.

8. A semiconductor device comprising:
 a substrate;
 a plurality of nanowires extending in a first direction and spaced apart from each other on the substrate, the plurality of nanowires including a first nanowire that is an uppermost nanowire of the plurality of nanowires;
 a gate insulating layer surrounding each of the plurality of nanowires;
 a gate electrode extending in a second direction intersecting the first direction and surrounding each of the plurality of nanowires, on the gate insulating layer;
 a source/drain on a sidewall of the gate electrode;
 a gate spacer between the gate electrode and the source/drain,
 wherein the gate spacer includes:
  a first inner spacer on a bottom surface the first nanowire;
  a second inner spacer on a top surface of the first nanowire; and
  an outer spacer on a top surface of the second inner spacer,
 wherein the outer spacer includes a first insulating material, and
 wherein the first inner spacer and the second inner spacer include a second insulating material different from the first insulating material.

9. The semiconductor device of claim 8, wherein a first dielectric constant of the first insulating material is greater than a second dielectric constant of the second insulating material.

10. The semiconductor device of claim 8,
 wherein the plurality of nanowires further includes a second nanowire between the substrate and the first nanowire, and
 wherein the first inner spacer is between the first nanowire and the second nanowire.

11. The semiconductor device of claim 8, further comprising a metal layer surrounding each of the plurality of nanowires, between the gate insulating layer and the gate electrode,
 wherein the metal layer includes tungsten (W).

12. The semiconductor device of claim 11, wherein the metal layer is configured to apply one of a tensile stress and a compressive stress to the plurality of nanowires.

13. A semiconductor device comprising:
 a substrate comprising a first region and a second region;
 a first nanowire spaced apart from the substrate in the first region;
 a second nanowire spaced apart from the substrate in the second region;
 a first gate insulating layer surrounding the first nanowire;
 a second gate insulating layer surrounding the second nanowire;
 a first metal layer surrounding the first nanowire, on the first gate insulating layer;
 a first gate electrode surrounding the first nanowire, on the first metal layer, wherein the first metal layer is between the first gate insulating layer and the first gate electrode;

a first gate spacer on a sidewall of the first gate electrode; and a second metal layer surrounding the second nanowire, on the second gate insulating layer, wherein the first gate spacer includes:
  a first inner spacer between the substrate and the first nanowire;
  a second inner spacer on a top surface of the first nanowire; and
  an outer spacer being in contact with a top surface of the second inner spacer, wherein the outer spacer has a first dielectric constant, and wherein the first inner spacer and the second inner spacer have a second dielectric constant different from the first dielectric constant.

14. The semiconductor device of claim 13,
wherein the first metal layer has a first crystal grain size, and
wherein the second metal layer has a second crystal grain size different from the first crystal grain size.

15. The semiconductor device of claim 14,
wherein the first region is an NMOS region and the second region is a PMOS region, and
wherein the first crystal grain size is greater than the second crystal grain size.

16. The semiconductor device of claim 14, wherein the first and second metal layers comprise a same material having the first crystal grain size in the first metal layer and the second crystal grain size in the second metal layer.

17. The semiconductor device of claim 13, wherein a first thickness of the first metal layer is different from a second thickness of the second metal layer.

18. The semiconductor device of claim 13,
wherein the first nanowire extends in a first direction,
wherein the second nanowire extends in a second direction,
wherein the first metal layer is in a region between the substrate and the first nanowire and extends in a third direction intersecting the first direction, and
wherein the second metal layer is in a region between the substrate and the second nanowire and extends in a fourth direction intersecting the second direction.

19. The semiconductor device of claim 13, further comprising a second gate electrode surrounding the second nanowire, on the second metal layer, wherein the second metal layer is between the second gate insulating layer and the second gate electrode.

20. The semiconductor device of claim 13, wherein both of the first metal layer and the second metal layer include tungsten (W).

* * * * *